(12) United States Patent
Ahn et al.

(10) Patent No.: US 9,780,049 B2
(45) Date of Patent: Oct. 3, 2017

(54) SEMICONDUCTOR PACKAGE

(71) Applicant: Samsung Electronics, Ltd., Suwon-si (KR)

(72) Inventors: Jin-chan Ahn, Hwaseong-si (KR); Sun-won Kang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/279,312

(22) Filed: May 15, 2014

(65) Prior Publication Data

US 2014/0339704 A1   Nov. 20, 2014

(30) Foreign Application Priority Data

May 16, 2013 (KR) .................. 10-2013-0056047

(51) Int. Cl.
*H01L 23/00* (2006.01)
*H01L 25/065* (2006.01)

(52) U.S. Cl.
CPC .............. *H01L 24/02* (2013.01); *H01L 24/73* (2013.01); *H01L 25/0657* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 2224/02375* (2013.01); *H01L 2224/0401* (2013.01); *H01L 2224/04042* (2013.01); *H01L 2224/04073* (2013.01); *H01L 2224/05554* (2013.01); *H01L 2224/131* (2013.01); *H01L 2224/16145* (2013.01); *H01L 2224/2919* (2013.01); *H01L 2224/32145* (2013.01); *H01L 2224/48105* (2013.01); *H01L 2224/48111* (2013.01); *H01L 2224/48227* (2013.01); *H01L 2224/73207* (2013.01); *H01L 2224/73253* (2013.01); *H01L 2224/73265* (2013.01); *H01L 2224/83101* (2013.01); *H01L 2225/0651* (2013.01); *H01L 2225/06513* (2013.01); *H01L 2225/06527* (2013.01); *H01L 2225/06558* (2013.01); *H01L 2225/06565* (2013.01);

(Continued)

(58) Field of Classification Search
CPC ...... H01L 24/46; H01L 24/02; H01L 25/0657
USPC ........................................................ 257/773
See application file for complete search history.

(56) References Cited

U.S. PATENT DOCUMENTS 5,364,009 A   11/1994   Takahashi et al.
5,870,289 A    2/1999   Tokuda et al.
(Continued)

FOREIGN PATENT DOCUMENTS

JP   58222553 A    12/1983
JP   08-148825    6/1996
(Continued)

*Primary Examiner* — Christine Enad
(74) *Attorney, Agent, or Firm* — Muir Patent Law, PLLC

(57) ABSTRACT

A semiconductor package includes a substrate; and first and second semiconductor chips sequentially disposed on the substrate so that active surfaces of the first and second semiconductor chips face each other, wherein the first and second semiconductor chips are center pad-type semiconductor chips each having I/O pads arranged in two columns to be adjacent to a central line thereof, and I/O pads of the second semiconductor chip are electrically connected directly to the substrate without intersecting the central line of the second semiconductor chip.

22 Claims, 19 Drawing Sheets

(52) U.S. Cl.
 CPC ............... *H01L 2924/00014* (2013.01); *H01L 2924/10161* (2013.01); *H01L 2924/181* (2013.01)

(56) References Cited

U.S. PATENT DOCUMENTS

| | | |
|---|---|---|
| 6,798,049 B1 | 9/2004 | Shin et al. |
| 6,958,532 B1 | 10/2005 | Nakayama et al. |
| 6,979,905 B2 | 12/2005 | Nishida et al. |
| 7,105,930 B2 | 9/2006 | Lua et al. |
| 7,298,033 B2 | 11/2007 | Yoo |
| 7,453,159 B2 | 11/2008 | Song et al. |
| 7,501,707 B2 | 3/2009 | Morishita et al. |
| 7,550,857 B1* | 6/2009 | Longo ..................... H01L 24/19 257/686 |
| 7,585,750 B2 | 9/2009 | Do et al. |
| 7,648,911 B2 | 1/2010 | Pagaila et al. |
| 7,952,181 B2 | 5/2011 | Takahashi |
| 7,964,948 B2 | 6/2011 | Lee et al. |
| 8,022,554 B2 | 9/2011 | Gupta et al. |
| 2003/0022465 A1 | 1/2003 | Wachtler |
| 2004/0229398 A1 | 11/2004 | Magerlein et al. |
| 2005/0200003 A1 | 9/2005 | Yoon et al. |
| 2005/0230850 A1* | 10/2005 | Taggart et al. ............... 257/784 |
| 2005/0242426 A1 | 11/2005 | Kwon et al. |
| 2006/0091560 A1 | 5/2006 | Kang et al. |
| 2006/0172465 A1 | 8/2006 | Brennan et al. |
| 2007/0059918 A1 | 3/2007 | Jung et al. |
| 2007/0296071 A1 | 12/2007 | Chiu et al. |
| 2008/0265397 A1* | 10/2008 | Lin et al. ..................... 257/691 |
| 2008/0272465 A1 | 11/2008 | Do et al. |
| 2010/0020583 A1* | 1/2010 | Kang et al. ..................... 365/51 |
| 2010/0148352 A1 | 6/2010 | Moden |
| 2010/0255614 A1 | 10/2010 | Uchida |
| 2011/0074015 A1 | 3/2011 | Suzuki |
| 2011/0156232 A1 | 6/2011 | Youn et al. |
| 2012/0038045 A1* | 2/2012 | Lee ............................ 257/738 |
| 2012/0043664 A1* | 2/2012 | Coteus et al. ............... 257/774 |
| 2012/0049355 A1 | 3/2012 | Hosokawa et al. |
| 2013/0082381 A1* | 4/2013 | Crisp ..................... G11C 5/04 257/737 |

FOREIGN PATENT DOCUMENTS

| | | |
|---|---|---|
| JP | 2001-077301 | 3/2001 |
| JP | 2004-047715 A | 2/2004 |
| JP | 2005-327755 | 11/2005 |
| JP | 2007-081408 | 3/2007 |
| KR | 10-2000-0027519 A | 5/2000 |
| KR | 10-2001-0018945 A | 3/2001 |
| KR | 10-2001-0062929 A | 7/2001 |
| KR | 10-0661297 B1 | 12/2006 |

* cited by examiner

SEMICONDUCTOR PACKAGE

CROSS-REFERENCE TO RELATED APPLICATIONS

This application claims the benefit of Korean Patent Application No. 10-2013-0056047, filed on May 16, 2013, in the Korean Intellectual Property Office, the disclosure of which is incorporated herein in its entirety by reference.

BACKGROUND

As semiconductor technologies have continuously developed, small-sized as well as high speed and high capacity semiconductor devices have been manufactured. In general, two or more semiconductor chips are stacked to form a high capacity semiconductor device. However, when the number of stacked semiconductor chips is increased, a redistribution routing in the semiconductor device becomes more and more complex. Also, due to the miniaturization trend, the line width of the redistribution routing is gradually becoming narrower, and thus, a method of implementing a simple redistribution routing is desirable.

SUMMARY

The disclosed embodiments provide a semiconductor package in which a redistribution routing of semiconductor chips is simplified so thus the semiconductor package has high reliability and performance.

According to one exemplary embodiment, a semiconductor package includes a substrate, and a pair of semiconductor chips disposed on the substrate so that active surfaces of the pair of semiconductor chips face each other. The pair of semiconductor chips include a first semiconductor chip disposed closer to the substrate and a second semiconductor chip disposed farther from the substrate. In addition, a plurality of connection terminals disposed on the substrate are electrically directly connected through the first semiconductor chip to a plurality of terminals disposed on the second semiconductor chip and to one or more semiconductor devices of the second semiconductor chip.

In one embodiment, the plurality of connection terminals disposed on the substrate are not electrically directly connected to a semiconductor device in the first semiconductor chip.

In one embodiment, to electrically directly connect the plurality of connection terminals disposed on the substrate to the plurality of terminals disposed on the second semiconductor chip, the plurality of connection terminals disposed on the substrate may be electrically connected to the plurality of terminals disposed on the second semiconductor chip via first routing redistribution wires on the first semiconductor chip.

For example, the first routing redistribution wires may connect a plurality of first routing terminals of the first semiconductor chip, which are electrically connected to corresponding connection terminals disposed on the substrate, to a plurality of respective second routing terminals of the first semiconductor chip, which are electrically connected to corresponding routing terminals disposed on the second semiconductor chip.

The first semiconductor chip may include first input/output (I/O) pad sets arranged in two columns to be adjacent to a central line of the first semiconductor chip, and the second semiconductor chip may include second (I/O) pad sets arranged in two columns to be adjacent to a central line of the second semiconductor chip. Locations and functions of the first I/O pad sets disposed on the first semiconductor chip may be the same as those of the second /O pad sets disposed on the second semiconductor chip.

The first routing redistribution wires may extend without intersecting the central line of the first semiconductor chip.

The second semiconductor chip may include: a plurality of third routing terminals corresponding to the plurality of second routing terminals, respectively; and second routing redistribution wires for electrically connecting the plurality of third routing terminals to corresponding I/O pads of the second I/O pad sets, respectively.

The plurality of second routing terminals and the plurality of third routing terminals may overlap with each other when an active surface of the first semiconductor chip and an active surface of the second semiconductor chip face each other.

The second routing redistribution wires may extend without intersecting the central line of the second semiconductor chip.

The first semiconductor chip may include a first I/O buffer circuit for buffering a signal that is input from or output to an external circuit, and the second semiconductor chip may include a second I/O buffer circuit for buffering a signal that is input from or output to an external circuit. The second I/O buffer circuit may be operably connected to the substrate, and the first I/O buffer circuit may be disabled. The first semiconductor chip may be configured to input or output a signal via the second I/O buffer circuit.

In one embodiment, the first semiconductor chip includes a plurality of fourth routing terminals electrically connected to an internal circuit of the first semiconductor chip, and the second semiconductor chip may include a plurality of fifth routing terminals electrically connected to an internal circuit of the second semiconductor chip. The plurality of fourth routing terminals may be electrically directly connected to the plurality of fifth routing terminals. The first semiconductor chip may be electrically connected to the second I/O buffer circuit of the second semiconductor chip via the plurality of fourth routing terminals and the plurality of fifth routing terminals to input or output a signal via the second I/O buffer circuit.

The first semiconductor chip may further include an auxiliary buffer circuit having a small buffering capacity compared to the second I/O buffer circuit to input or output a signal via the second I/O buffer circuit.

I/O pads of the second I/O pad sets may be electrically directly connected to the second I/O buffer circuit corresponding to each of the I/O pads and not to any other I/O buffer circuits.

In one embodiment, the one or more semiconductor devices of the second semiconductor chip are electrically connected to the plurality of connection terminals disposed on the substrate without the use of through substrate vias.

According to another embodiment, a semiconductor package includes: a substrate; and a pair of semiconductor chips disposed on the substrate so that active surfaces of the pair of semiconductor chips face each other, wherein the pair of semiconductor chips include a slave chip disposed closer to the substrate and a master chip disposed farther from the substrate, the master chip is a center pad-type semiconductor chip in which a plurality of I/O pads are symmetrically arranged in two columns to be adjacent to a central line of the master chip, and wires for sending and receiving signals between the plurality of I/O pads of the master chip and the substrate do not intersect the central line.

The slave chip may include a plurality of first I/O pads symmetrically arranged in two columns to be adjacent to the central line of the slave chip, the plurality of I/O pads of the master chip may be a plurality of second I/O pads, and locations and functions of the plurality of first I/O pads may be the same as those of the plurality of second I/O pads.

The plurality of second I/O pads may be electrically directly connected to a plurality of connection terminals disposed on the substrate.

The plurality of second I/O pads may be electrically connected to the plurality of connection terminals disposed on the substrate via first routing redistribution wires formed on the slave chip.

The first routing redistribution wires may connect a plurality of first routing terminals, which are electrically connected to corresponding connection terminals disposed on the substrate, and a plurality of second routing terminals which are electrically connected to corresponding terminals disposed on the master chip.

The master chip may include: a plurality of third routing terminals corresponding to the plurality of second routing terminals, respectively; and second routing redistribution wires for electrically connecting the plurality of third routing terminals to corresponding I/O pads of the second I/O pads, respectively.

A size of the master chip and a size of the slave chip may be substantially the same as each other.

The plurality of first routing terminals may be electrically directly connected to the corresponding connection terminals disposed on the substrate by using bonding wires.

The master chip may include a buffer circuit for buffering a signal that is input from or output to an external circuit, and the slave chip may be configured to input or output a signal via the buffer circuit of the master chip.

In one embodiment, each column of the at least two columns includes at least four I/O pads.

According to another embodiment, a semiconductor package includes a substrate, and first and second semiconductor chips sequentially disposed on the substrate so that active surfaces of the first and second semiconductor chips face each other. The first and second semiconductor chips are center pad-type semiconductor chips each having I/O pads arranged in two columns to be adjacent to a central line thereof, the first semiconductor chip includes first routing terminals that are connected to connection terminals disposed on the substrate, and the second semiconductor chip includes second routing terminals, which are provided at locations corresponding to the first routing terminals, and routing redistribution wires for connecting the second routing terminals to I/O pads of the second semiconductor chip.

According to another embodiment, a semiconductor package includes a substrate, and first and second semiconductor chips sequentially disposed on the substrate so that active surfaces of the first and second semiconductor chips face each other. The first and second semiconductor chips are center pad-type semiconductor chips each in which a plurality of I/O pads are symmetrically arranged in two columns to be adjacent to a central line thereof. The first semiconductor chip includes first routing redistribution wires on an active surface thereof, a plurality of first routing terminals, which are connected to corresponding connection terminals disposed on the substrate, and a plurality of second routing terminals which are connected to corresponding terminals disposed on the second semiconductor chip, the second semiconductor chip includes second routing redistribution wires on an active surface thereof, the second routing redistribution wires electrically connects a plurality of third routing terminals corresponding to the plurality of second routing terminals to I/O pads of the second semiconductor chip, and the first routing redistribution wires extend without intersecting the central line of the first semiconductor chip and the second routing redistribution wires extend without intersecting the central line of the second semiconductor chip.

The first semiconductor chip may be located between the substrate and the second semiconductor chip, and the plurality of first routing terminals may be connected to the corresponding connection terminals disposed on the substrate through wire bonding.

In one embodiment, a semiconductor package includes: a package substrate; a plurality of connection terminals on the package substrate; a first semiconductor chip stacked on the substrate and having a backside surface facing the substrate and an active surface opposite the backside surface; a second semiconductor chip stacked on the first semiconductor and having an active surface facing the active surface of the first semiconductor chip and a backside surface opposite the active surface; a plurality of first semiconductor devices included in the first semiconductor chip; and a plurality of second semiconductor devices included in the second semiconductor chip. The plurality of second semiconductor devices connect to the plurality of connection terminals through only a series of conductive components contacting each other, and the plurality of first semiconductor devices connect to the plurality of connection terminals through the series of conductive components and through the plurality of second semiconductor devices.

In one embodiment, the plurality of first semiconductor devices are electrically connected to the plurality of connection terminals through a first set of wires in the first semiconductor chip that do not cross a center line of the first semiconductor chip

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
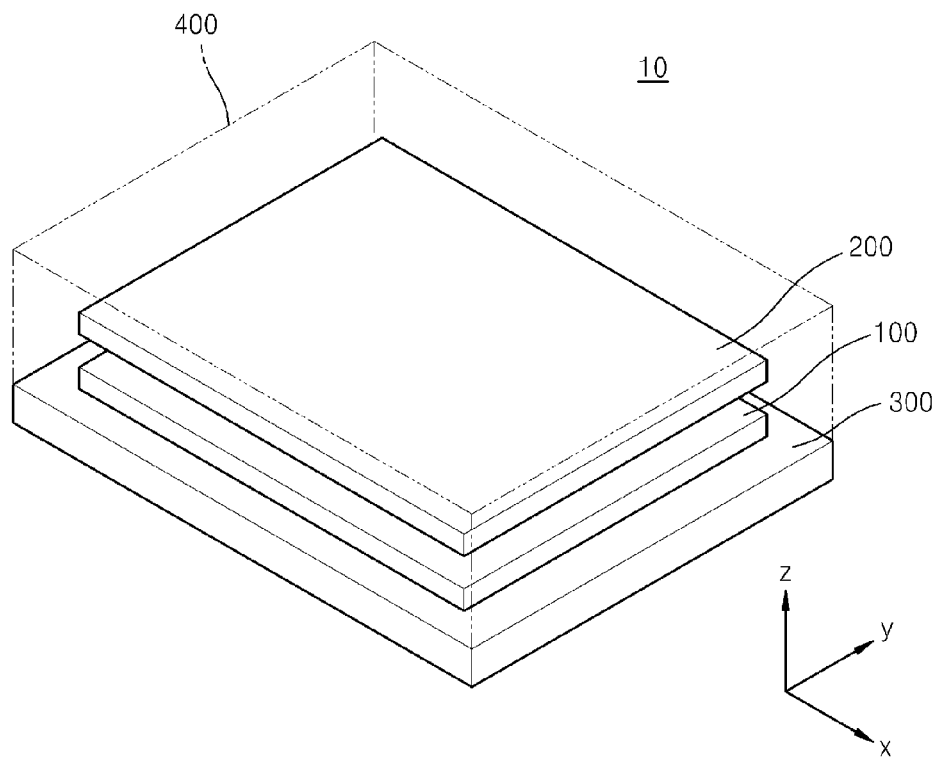
FIG. 1 is a perspective view illustrating a semiconductor package according to one exemplary embodiment.

Hereinafter, exemplary embodiments will be described in detail with reference to the accompanying drawings. However, the invention may be embodied in many different forms and should not be construed as being limited to the embodiments set forth herein. Like reference numerals refer to like constitutional elements throughout the drawings. Further, a variety of elements and regions in the drawings are schematically illustrated. Thus, the inventive concept is not limited to the relative sizes or intervals shown in the accompanying drawings.

Although terms such as 'first' and 'second' can be used to describe various elements, these elements are not to be limited by these terms unless the context indicates otherwise. These terms can be used to classify a certain element from another element. For example, a first element can be named a second element without changing the scope of the inventive concept, and likely the second element can be named the first element.

The terminology used in the application is used only to describe specific embodiments and does not have any intention to limit the inventive concept. An expression in the singular includes an expression in the plural unless they are clearly different from each other in a context. In the application, it should be understood that terms such as "comprises," "includes" and "has" are used to indicate the existence of an implemented feature, number, step, operation, element, part, or a combination of them without excluding in advance the possibility of existence or addition of one or more other features, numbers, steps, operations, elements, parts, or combination of them.

It will also be understood that when a layer, element, or substrate is referred to as being "on," "above," "below," "connected to," or "coupled to" another layer, element, or substrate, it can be directly on, above, below, connected to, or coupled to the other layer, element or substrate, or intervening layers, elements, or substrates may also be present. In contrast, when an element is referred to as being "directly on," "directly above," "directly below," "directly connected to," or directly coupled to" another element, there are no intervening elements present. The term "contact," however, as used herein, implies a direct contact, unless indicated as otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used to modify one of these terms to further emphasize this meaning.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

All terms used herein including technical or scientific terms should be understood to have the same meaning as those generally understood by those of ordinary skill in the art unless they are defined differently. It should be understood that terms generally used, which are defined in a dictionary, have the same meaning as in the context of related technology, and the terms are not to be understood as having an excessively formal meaning unless they are clearly defined in the application. As used herein, the term "and/or" includes any and all combinations of one or more of the associated listed items.

FIG. 1 is a perspective view illustrating a semiconductor package 10 according to one exemplary embodiment. Referring to FIG. 1, a first semiconductor chip 100 and a second semiconductor chip 200 may be sequentially stacked on a substrate 300, for example, such that the first semiconductor chip 100 is between the substrate and the second semiconductor chip 200. The substrate 300 is more specifically referred to herein as a package substrate 300. The first semiconductor chip 100 and the second semiconductor chip 200 may be disposed so that active surfaces thereof face each other. For example, the first semiconductor chip 100 may be mounted on the package substrate 300 so that a backside surface of the chip 100 (e.g., a surface where no circuitry or build-up portions have been added) faces the package substrate 300 and an active surface of the chip 100 is opposite the backside surface. The second semiconductor chip 200 may be mounted on the first semiconductor chip 100, so that an active surface of the second semiconductor chip 200 faces the active surface of the first semiconductor chip 100, and a backside surface of the second semiconductor chip 200 is opposite the active surface. Also, the first semiconductor chip 100 and the second semiconductor chip 200 may be encapsulated by an encapsulating member 400.

The substrate 300 may be a package substrate, and in particular, may be a substrate in which a circuit is formed on an insulating substrate by using a conductor. For example, the substrate 300 may be a printed circuit board (PCB), such as a nonflexible printed circuit board or a flexible printed circuit board (FPCB), or a tape substrate. However, the inventive concept is not limited thereto.

In one embodiment, each of the first semiconductor chip 100 and the second semiconductor chip 200 is a memory chip. The memory chip may be any of various memory circuits, such as dynamic random access memory (DRAM), static random access memory (SRAM), NAND-type or NOR-type flash memory, phase-change RAM (PRAM), resistive RAM (RRAM), ferroelectric RAM (FeRAM), magnetic RAM (MRAM), and the like. However, the inventive concept is not limited thereto.

At least one of the first semiconductor chip 100 and the second semiconductor chip 200 and may also be a logic chip, or may alternatively be a logic chip. Additionally, in some cases, at least one of the first semiconductor chip 100 and the second semiconductor chip 200 may be an application processor (AP).

The first semiconductor chip 100 and the second semiconductor chip 200 may be of the same type or of different types. As described in more detail below, a passivation layer for protecting the first and second semiconductor chips 100 and 200 from external moisture, heat, impact, or the like may be formed on the active surfaces of the first and second semiconductor chips 100 and 200. Conductive lines for redistribution may be formed in the passivation layer and/or on the passivation layer.

The encapsulating member 400 may be formed of polymer material such as resin. For example, the encapsulating member 400 may be an epoxy molding compound (EMC), but is not limited thereto. In one embodiment, the encapsulating member 400 encapsulates sides and/or upper surfaces of the first and second semiconductor chips 100 and 200. Also, the encapsulating member 400 may fill a space between the first semiconductor chip 100 and the second semiconductor chip 200.

Figure 2:
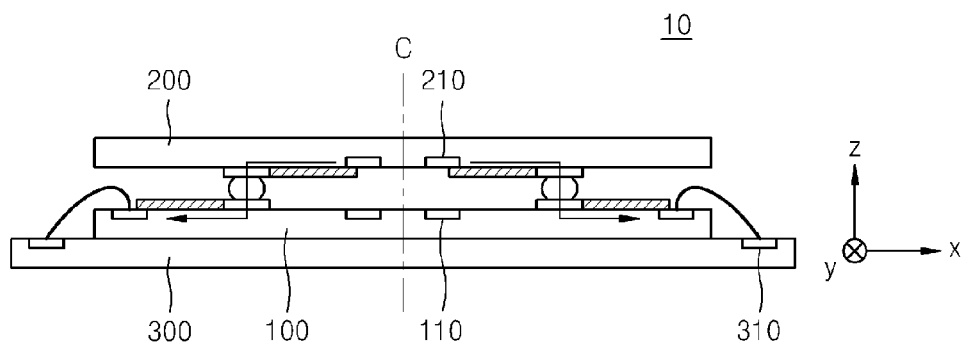
FIG. 2 is a cross-sectional side view conceptually illustrating a cross section of a semiconductor package in a y-direction, according to one exemplary embodiment.

FIG. 2 is a cross-sectional side view conceptually illustrating a cross section of a semiconductor package 10 in a y-direction, according to one exemplary embodiment.

Referring to FIG. 2, a first semiconductor chip 100 may include two columns of input and output (I/O) pads 110 that are adjacent to a central line C thereof and are arranged in a column-structure, and a second semiconductor chip 200 may also include two columns of I/O pads 210 that are adjacent to the central line C thereof and are arranged in a column-structure. The I/O pads 110 of the first semiconductor chip 100 are referred to as first I/O pads 110, and the I/O pads 210 of the second semiconductor chip 200 are referred to as second I/O pads 210. Although, in FIG. 2, the first and second I/O pads 110 and 210 are arranged in a two-column-structure, the inventive concept is not limited thereto and the I/O pads 110 and 210 may be disposed in another arrangement.

In one embodiment, the second I/O pads 210 are electrically directly connected to connection terminals 310 formed on a substrate 300 via conductive components such as redistribution wires, pads, terminals, and/or bumps. Here, "electrically directly connected" is defined as being electrically connected via only conductive components, such as wires, pads, terminals, and/or bumps without any active device or passive device interposed therebetween. As such, in certain embodiments, two components that are electrically directly connected are physically connected through a consecutive set of electrically-conductive materials (e.g., conductors) in contact with each other without any non-electrically-conductive material (such as a dielectric, air, or insulative material) disposed to separate the connection.

As shown in FIG. 2, the first and second I/O pads 110 and 210 may be electrically directly connected to corresponding connection terminals 310 on the substrate 300 along a path indicated by an arrow. In this case, the connection terminals 310 may not be electrically directly connected to a semiconductor device in the first semiconductor chip 100. In particular, the second semiconductor chip 200, which includes the second I/O pads 210 which are electrically directly connected to the connection terminals 310, may function as a master chip. The first semiconductor chip 100, which does not have a semiconductor device which is electrically directly connected to the connection terminals 310, may function as a slave chip.

Figure 3:
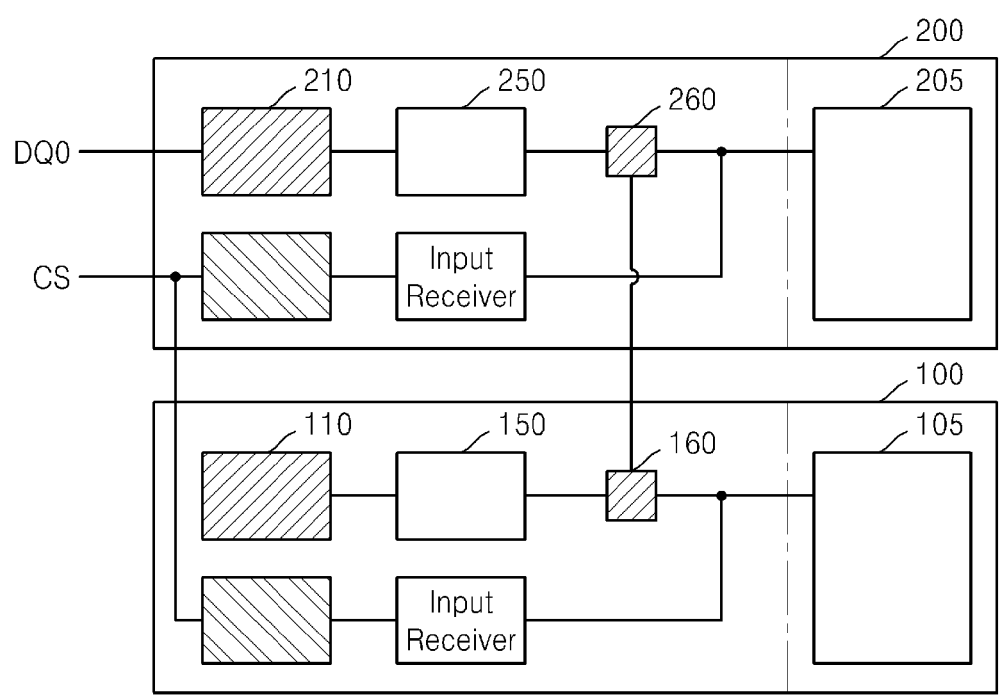
FIG. 3 is a circuit diagram for explaining a relation between a first semiconductor chip and a second semiconductor chip, according to one exemplary embodiment.

FIG. 3 is a circuit diagram for explaining a relation between the first semiconductor chip 100 and the second semiconductor chip 200, according to one exemplary embodiment.

Referring to FIG. 3, the first semiconductor chip 100 and the second semiconductor chip 200 include a first I/O pad 110 and a second I/O pad 210, respectively. The first I/O pad 110 and the second I/O pad 210 are connected to a first I/O buffer circuit 150 and a second I/O buffer circuit 250, respectively. The first I/O buffer circuit 150 and the second I/O buffer circuit 250 are connected to an internal circuit 105 of the first semiconductor chip 100 and an internal circuit 205 of the second semiconductor chip 200, respectively. For example, each of the first and second I/O buffer circuits 150 and 250 and the internal circuits 105 and 205 may include circuit elements and semiconductor devices, such as resistors, capacitors, and transistors.

A terminal 160 is provided between the internal circuit 105 of the first semiconductor chip 100 and the first I/O pad 110, a terminal 260 is provided between the internal circuit 205 of the second semiconductor chip 200 and the second I/O pad 210, and the terminal 160 and the terminal 260 may be electrically directly connected to each other.

When the second I/O pad 210 receives a signal DQO from a connection terminal 310 of the substrate 300, the signal DQO may be delivered to the internal circuit 105 of the first semiconductor chip 100 or the internal circuit 205 of the second semiconductor chip 200 according to a chip selection signal CS.

When the chip selection signal CS selects the second semiconductor chip 200, the second semiconductor chip 200 may send and receive a signal and/or data to and from the substrate 300 via a path including the second I/O pad 210, the second I/O buffer circuit 250, the terminal 260, and the internal circuit 205.

When the chip selection signal CS selects the first semiconductor chip 100, the first semiconductor chip 100 may send and receive a signal and/or data to and from the substrate 300 via a path including the second I/O pad 210, the second I/O buffer circuit 250, the terminal 260, the terminal 160, and the internal circuit 105. Thus, in this case, the first I/O pad 110 and the first I/O buffer circuit 150 may be in a disabled state.

As described above, the first semiconductor chip 100 may send and receive a signal and/or data to and from the substrate 300 via the second semiconductor chip 200.

Figure 4A:
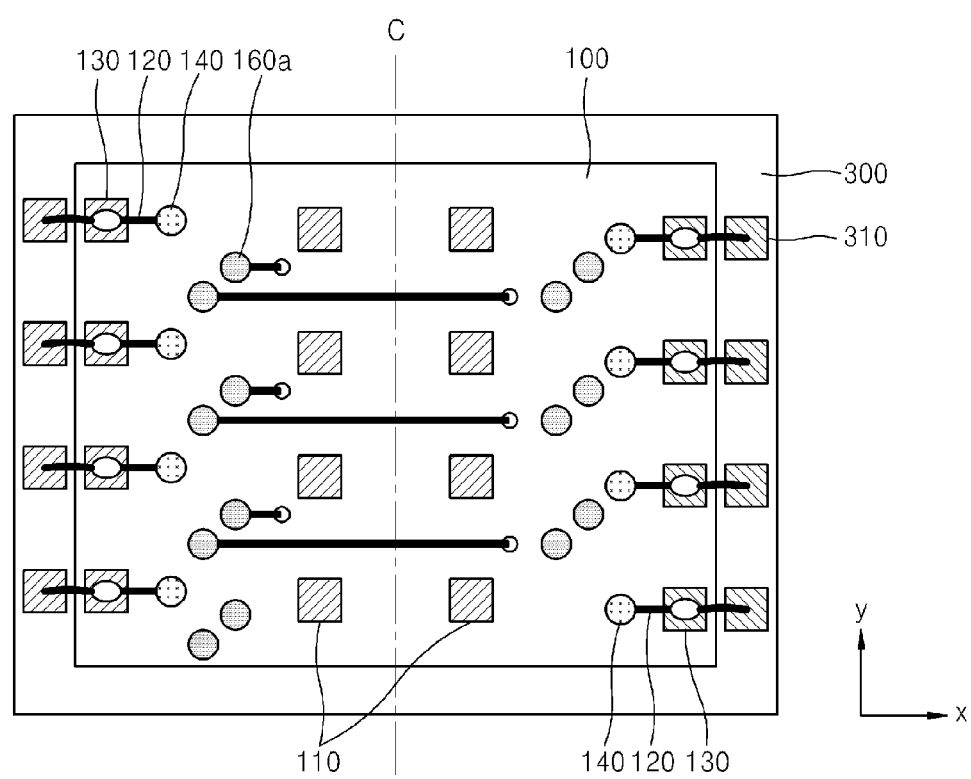
FIG. 4A is a plan view illustrating a first semiconductor chip and a substrate, according to one exemplary embodiment.
Figure 4B:
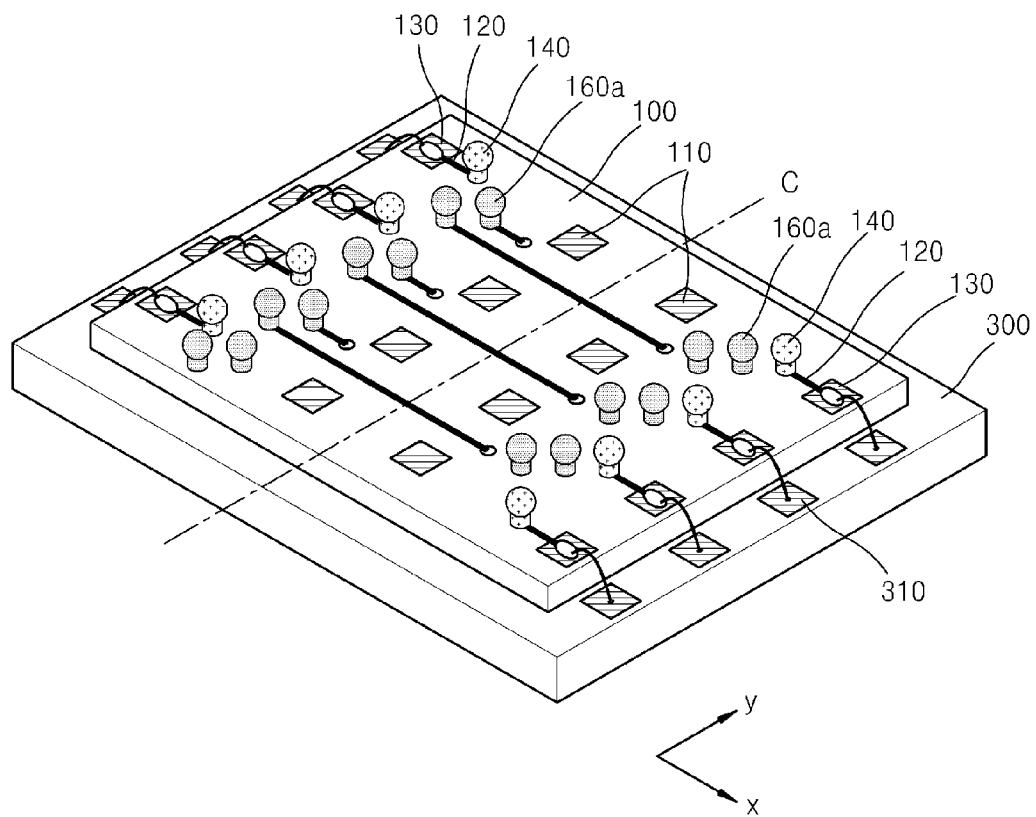
FIG. 4B is a perspective view illustrating a first semiconductor chip and a substrate, according to one exemplary embodiment.

FIG. 4A is a plan view illustrating a first semiconductor chip 100 and a substrate 300, according to one exemplary embodiment, and FIG. 4B is a perspective view illustrating the first semiconductor chip 100 and the substrate 300, according to one exemplary embodiment.

Referring to FIGS. 4A and 4B, the first semiconductor chip 100 is disposed on the substrate 300. First I/O pad sets 110, which include I/O pads symmetrically arranged in two columns to be adjacent to the central line C of the first semiconductor chip 100, may be provided on an active surface of the first semiconductor chip 100. Each I/O pad set 110 may include a plurality of I/O pads. Though only four pads are shown in FIGS. 4A and 4B, additional pads may be included in each column.

First routing redistribution wires 120 (more generally referred to herein as routing distribution lines 120) may be disposed along both edges that are parallel with the central line C of the first semiconductor chip 100. The first routing redistribution wires 120 may be connected to first routing terminals 130 and second routing terminals 140. One or more conductive components directly connected to each other or combined to form a single conductive component may be referred to as conductive interconnects. Therefore, a first routing terminal 130, redistribution wire 120, and second routing terminal 140 may be referred to herein as a conductive interconnects.

The first routing terminals 130 are electrically directly connected to corresponding connection terminals 310 on the substrate 300, respectively. For example, the first routing terminals 130 may be electrically directly connected to the connection terminals 310 via bonding wires. In one embodiment, the first routing terminals 130 are conductive pads at the surface of the first semiconductor chip. In one embodiment, the pads are not connected to internal circuitry in the first semiconductor chip. However, the inventive concept is not limited thereto.

The second routing terminals 140 may be provided to connect the first routing redistribution wires 120 to corresponding terminals of the second semiconductor chip 200, respectively. As shown in FIG. 4B, in one embodiment, the second routing terminals 140 include bumps. For example, in certain embodiments, these and other routing terminals illustrated in a similar manner may include conductive material that can be electrically and physically connected to other routing terminals in a one-to-one manner. For example, a second routing terminal 140 may include a solder material that can be heat treated so that it physically bonds to another routing terminal formed of a solder material or to a conductive pad or other terminal. Two terminals may thus be connected to form a conductive interconnect. In certain embodiments, the bottom portion of the terminals 140 and other similarly shaped terminals has a shape and is formed of a material that serves to maintain a separation between the two chips when such a heat treatment occurs. However, the inventive concept is not limited to the above described embodiments, and the second routing terminals 140 may be formed of other conductive material configured to form an electrical connection to other terminals of semiconductor chips 100 and 200 and substrate 300.

As shown in FIGS. 4A and 4B, the first routing redistribution wires 120 extend without intersecting the central line C of the first semiconductor chip 100 and may connect the first routing terminals 130 to the second routing terminals 140.

Although in FIGS. 4A and 4B eight pairs of terminals by which the substrate 300 and the first semiconductor chip 100 are connected to each other are illustrated, the inventive concept is not limited thereto. In addition, although in FIGS. 4A and 4B, extending portions of the first routing redistribution wires 120 are exposed to the outside of an upper surface of the first semiconductor chip 100, the extending portions of the first routing redistribution wires 120 may not be so exposed, and may be covered, for example, by a passivation layer of the first semiconductor chip 100.

Figure 5A:
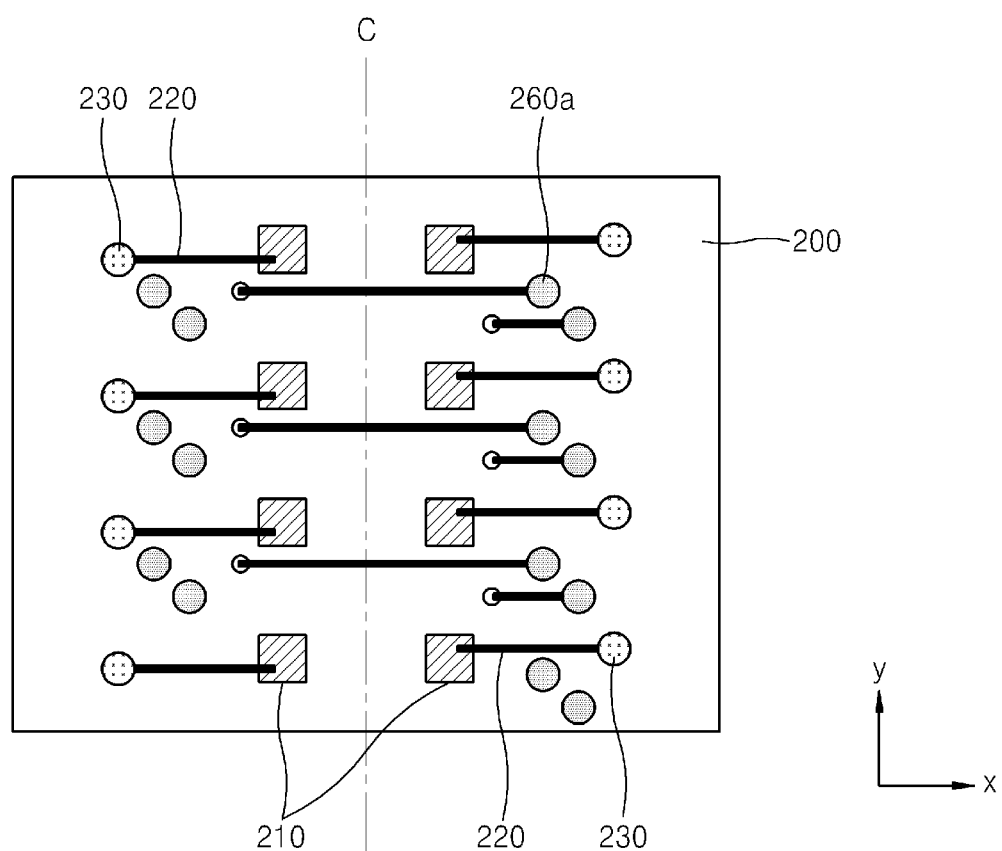
FIG. 5A is a plan view illustrating a second semiconductor chip according to one exemplary embodiment.
Figure 5B:
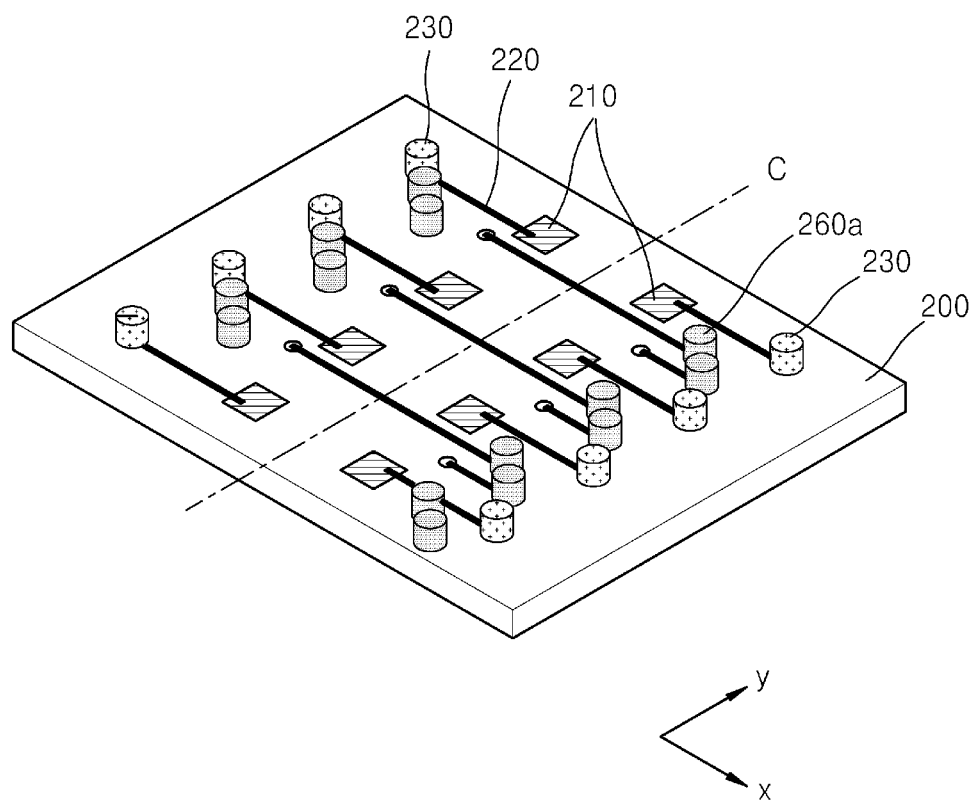
FIG. 5B is a perspective view illustrating a second semiconductor chip according to one exemplary embodiment.

FIG. 5A is a plan view illustrating a second semiconductor chip 200 according to on exemplary embodiment, and FIG. 5B is a perspective view illustrating the second semiconductor chip 200 according to one exemplary embodiment.

Referring to FIGS. 5A and 5B, second I/O pad sets 210, which includes I/O pads symmetrically arranged in two columns to be adjacent to a central line C of the second semiconductor chip 200, may be provided on an active surface of the second semiconductor chip 200.

Second routing redistribution wires 220 may be provided for the second I/O pad sets 210, respectively. The second routing redistribution wires 220 may extend without intersecting the central line C of the second semiconductor chip 200. Although in FIGS. 5A and 5B extending portions of the second routing redistribution wires 220 are exposed to the outside of an upper surface of the second semiconductor chip 200, the extending portions of the second routing redistribution wires 220 may not be so exposed, and may be covered, for example, by a passivation layer of the second semiconductor chip 200.

Third routing terminals 230 may be provided at ends of the second routing redistribution wires 220 extending from the second I/O pad sets 210. In one embodiment, the third routing terminals 230 are physically and/or electrically connected to the corresponding second routing terminals 140 provided on the first semiconductor chip 100. Thus, locations of the second routing terminals 140 and locations of the third routing terminals 230 are configured to overlap with each other at the same location when the first semiconductor chip 100 and the second semiconductor chip 200 are stacked so that the active surfaces of the first and second semiconductor chips 100 and 200 face each other.

Considering all of FIGS. 4A, 4B, 5A, and 5B, an input and output path from the connection terminals 310 of the substrate 300 to the second I/O pad sets 210 of the second semiconductor chip 200 is configured so as not to intersect the central line C of the second semiconductor chip 200.

The first semiconductor chip 100 may include a plurality of fourth routing terminals 160a electrically connected to the internal circuit 105 of the first semiconductor chip 100. The second semiconductor chip 200 may include a plurality of fifth routing terminals 260a electrically connected to the internal circuit 205 of the second semiconductor chip 200. The plurality of fourth routing terminals 160a and the plurality of fifth routing terminals 260a may be configured to overlap with each other at the same location when the first semiconductor chip 100 and the second semiconductor chip 200 are stacked so that the active surfaces of the first and second semiconductor chips 100 and 200 face each other. As such, a group of terminals 160a align respectively with a group of terminals 260a and connect to those respective terminals.

In this case, the plurality of fourth routing terminals 160a may be directly electrically connected to the plurality of fifth routing terminals 260a corresponding thereto. Furthermore, the plurality of fourth routing terminals 160a may directly physically contact the plurality of fifth routing terminals 260a corresponding thereto. In one embodiment, each fourth routing terminal 160a is bonded to a respective fifth routing terminal 260a, such that at least a portion of the terminals are physically shared.

Figure 6:
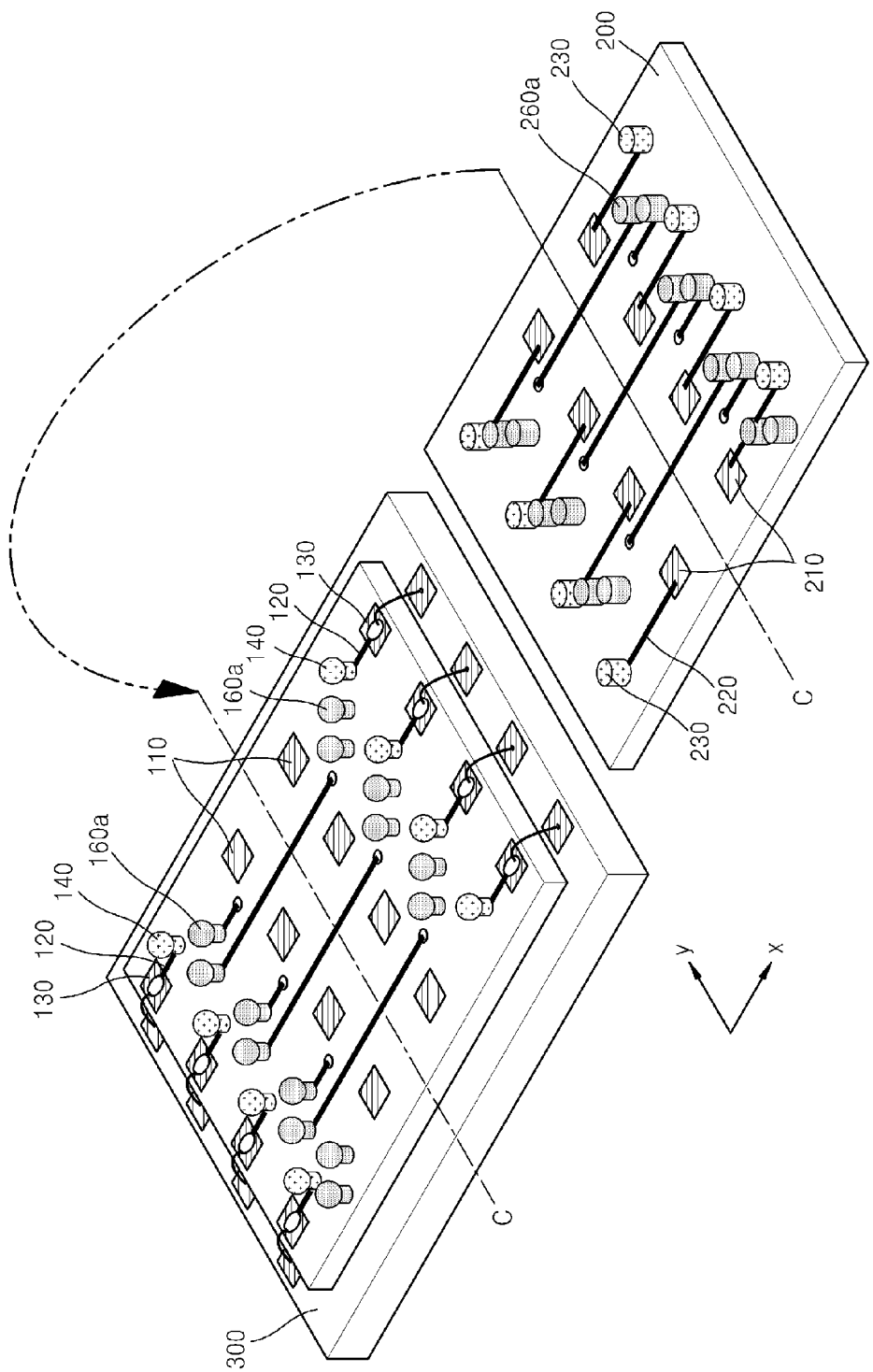
FIG. 6 is an exploded perspective view illustrating a connection relation between a first semiconductor chip and a second semiconductor chip, according to one exemplary embodiment.

FIG. 6 is an exploded perspective view illustrating a connection relation between the first semiconductor chip 100 and the second semiconductor chip 200, according to one exemplary embodiment. The components illustrated in FIG. 6 are the same as those illustrated in FIGS. 4A, 4B, 5A, and 5B, and thus are not repeatedly explained.

Referring to FIG. 6, the first semiconductor chip 100 and the second semiconductor chip 200 may be configured such that the active surfaces thereof face each other, by flipping the second semiconductor chip 200 about an axis parallel to the central line C of the semiconductor chips 100 and 200. In this case, the first semiconductor chip 100 and the second semiconductor chip 200 may be configured so that the second routing terminals 140 of the first semiconductor chip 100 overlap with the third routing terminals 230 of the second semiconductor chip 200. In addition, the first semiconductor chip 100 and the second semiconductor chip 200 may be configured so that the fourth routing terminals 160a of the first semiconductor chip 100 overlap with the fifth routing terminals 260a of the second semiconductor chip 200

In one embodiment, the first semiconductor chip 100 may have a same size as the second semiconductor chip 200. For example, the semiconductor chips 100 and 200 may have the same areas of the upper surfaces or lower surfaces thereof. The semiconductor chips 100 and 200 may have outer edges that align when the different routing terminals are connected in the manner described above.

The first I/O pad sets 110 of the first semiconductor chip 100 may be disposed at the same position as the second I/O pad sets 210 of the second semiconductor chip 200, and the number of first I/O pad sets 110 is the same as that of second I/O pad sets 210. The first I/O pad sets 110 of the first semiconductor chip 100 and the second I/O pad sets 210 of the second semiconductor chip 200 may have the same respective functions. However, although the first I/O pad sets 110 of the first semiconductor chip 100 and the second I/O pad sets 210 of the second semiconductor chip 200 may have the same function, any one of the first I/O pad sets 110 and the second I/O pad sets 210 may be disabled and thus may not operate in actual use.

When the second semiconductor chip 200 is put on the first semiconductor chip 100, the second semiconductor chip 200 may function as a master chip, and from a logical point of view, the substrate 300 may communicate with the first semiconductor chip 100, which functions as the slave chip, via the second semiconductor chip 200. For example, the substrate 300 may communicate electrically directly with active circuit components of the second semiconductor chip 200, and electrically indirectly with the active circuit components of the first semiconductor chip 100.

However, although from a physical point of view signals/data which the substrate 300 transmits or receives may be delivered to the second semiconductor chip 200 after being transmitted to the first semiconductor chip 100, the signals/data may not be directly delivered to the internal circuit 105 of the first semiconductor chip 100 but may be directly delivered only to the second semiconductor chip 200.

In more detail, signals/data delivered to the first routing terminals 130 via the connection terminals 310 of the substrate 300 are delivered to the third routing terminals 230 of the second semiconductor chip 200 via the first routing redistribution wires 120 and the second routing terminals 140 of the first semiconductor chip 100. Continuously, the signals/data delivered to the third routing terminals 230 are delivered to the second I/O pads 210 via the second routing redistribution wires 220. In this manner, the signals/data which the substrate 300 transmits are delivered to the second semiconductor chip 200. Signals/data that are transmitted from the second semiconductor chip 200 may be delivered to the substrate 300 in reverse order.

Functions and locations of the plurality of connection terminals 310 disposed on the substrate 300 are prescribed according to various standards such as the joint electron device engineering council (JEDEC), and thus, changing the functions and locations of the plurality of connection terminals 310 may increase the manufacturing cost and manufacturing efficiency.

The functions and locations of the plurality of connection terminals 310 disposed on the substrate 300 are prescribed based on the premise that one semiconductor chip is mounted on the substrate 300 in a flip-chip form. Thus, when, as shown in FIG. 6, an active surface of a center pad-type semiconductor chip that is electrically directly connected to the substrate 300 does not face the substrate 300 but the opposite direction to the substrate 300, redistribution wires for connecting I/O pads of the center pad-type semiconductor chip to the substrate are twisted (e.g., they overlap with each other both vertically and horizontally when viewed from above).

Figure 17:
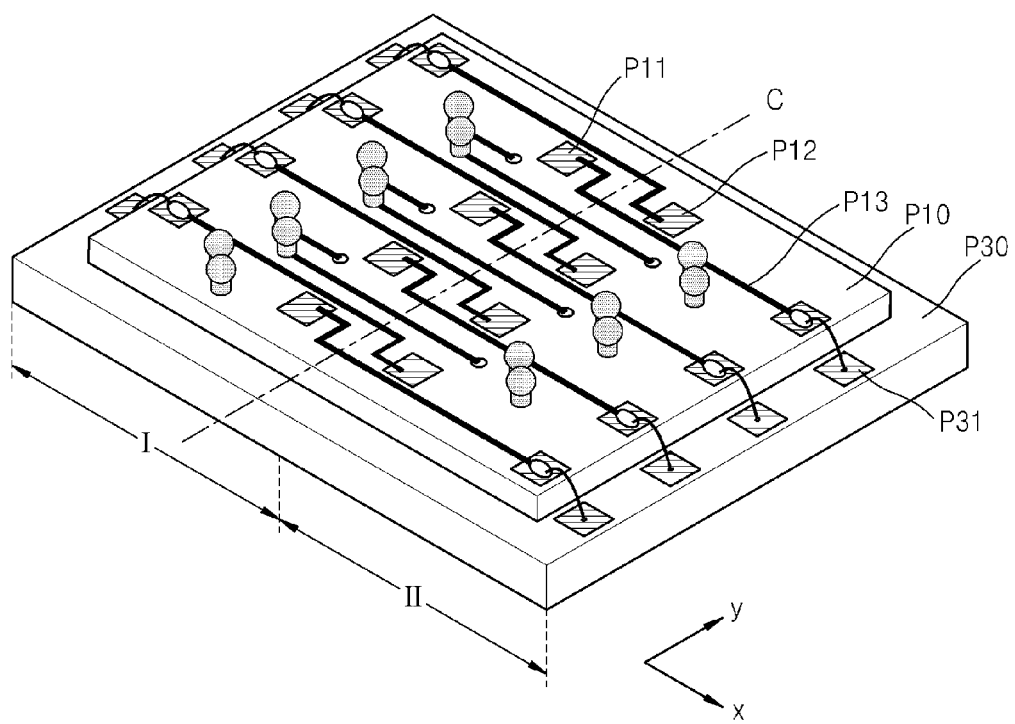
FIG. 17 is a perspective view for explaining a problem occurring when a center pad-type semiconductor chip mounted so that an active surface thereof faces the opposite direction to a substrate is electrically connected directly to the substrate.

FIG. 17 is a perspective view for explaining a problem occurring when a center pad-type semiconductor chip mounted so that an active surface thereof faces the opposite direction to a substrate is electrically connected directly to the substrate.

Referring to FIG. 17, a semiconductor chip P10 is mounted on a substrate P30. As described above, various standards such as JEDEC are used based on the premise that a center pad-type semiconductor chip is mounted on the substrate P30 in a flip-chip form. Thus, a large-scale design change may increase the manufacturing efficiency and manufacturing cost.

A semiconductor package may be divided into two parts, i.e., part I and part II, based on the central line C of the semiconductor chip P10. According to the standards, it is expected that I/O pads P11 of the part I will be connected to connection terminals P31 disposed in the part II on the substrate P30. In addition, according to the standards, it is expected that I/O pads P12 of the part II will be connected to connection terminals P31 disposed in the part I on the substrate P30. Thus, when the semiconductor chip P10 is formed in a flip-chip form, redistribution wires extending from the I/O pads P11 and P12 may be electrically connected directly to the connection terminals P31 of the substrate P30 without interesting the central line C.

However, when an active surface of the semiconductor chip P10 does not face the substrate P30 but the opposite direction to the substrate P30 as shown in FIG. 17, the redistribution wires P13 intersect the central line C and extend through the interval between each of the I/O pads P11 and P12 to connect each of the I/O pads P11 and P12 to a corresponding one of the connection terminals P31 positioned in the opposite side of the semiconductor chip P10 based on the central line C. Since the interval between each of the I/O pads P11 and P12 is very narrow due to the miniaturization of semiconductor devices, the number of redistribution wires which may pass through the interval or the width of each redistribution wire is limited. Due to this reason, simplification of the routing of redistribution wires is beneficial.

In certain disclosed embodiments, the routing of redistribution wires may be greatly simplified by configuring the substrate 300 and the semiconductor chips 100 and 200 as described with reference to FIGS. 4A, 4B, 5A, 5B, and 6.

When signals/data are transmitted from the substrate 300 to the second semiconductor chip 200, the signals/data may pass through the first semiconductor chip 100 without passing through the internal circuit 105 or an I/O buffer 150 of the first semiconductor chip 100. Furthermore, when the signals/data are transmitted from the substrate 300 to the second semiconductor chip 200, the signals/data may pass through the first semiconductor chip, but may be electrically directly transmitted to the second semiconductor chip 200 without passing through any active device and/or any passive device of the first semiconductor chip 100.

In this manner, when signals/data are transmitted from the substrate 300 to the second semiconductor chip 200 or vice versa, the signals/data may be transmitted without physically intersecting the central line C of the second semiconductor chip 200.

When the first and second semiconductor chips 100 and 200 are configured in this manner, the first semiconductor chip 100 may also use the second I/O buffer circuit 250 of FIG. 3, which is an I/O buffer circuit of the second semiconductor chip 200, but sufficient input and output buffering may not be achieved. Thus, an additional auxiliary buffer circuit may be added to the first semiconductor chip 100.

Figure 7A:
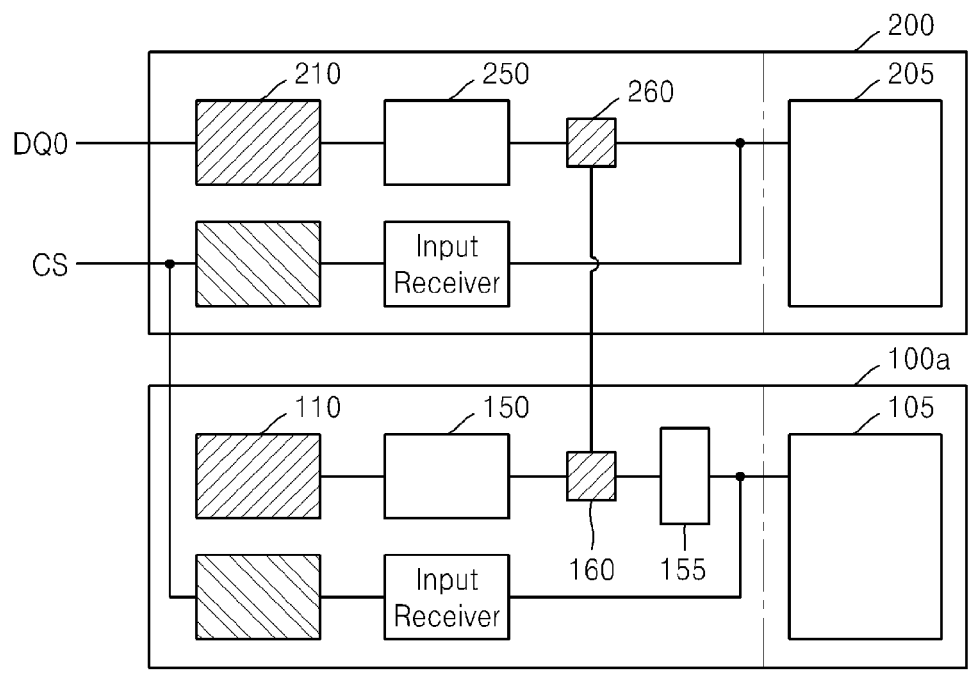
FIGS. 7A and 7B are circuit diagrams each illustrating a semiconductor package having an additional auxiliary buffer circuit, according to one exemplary embodiment.
Figure 7B:
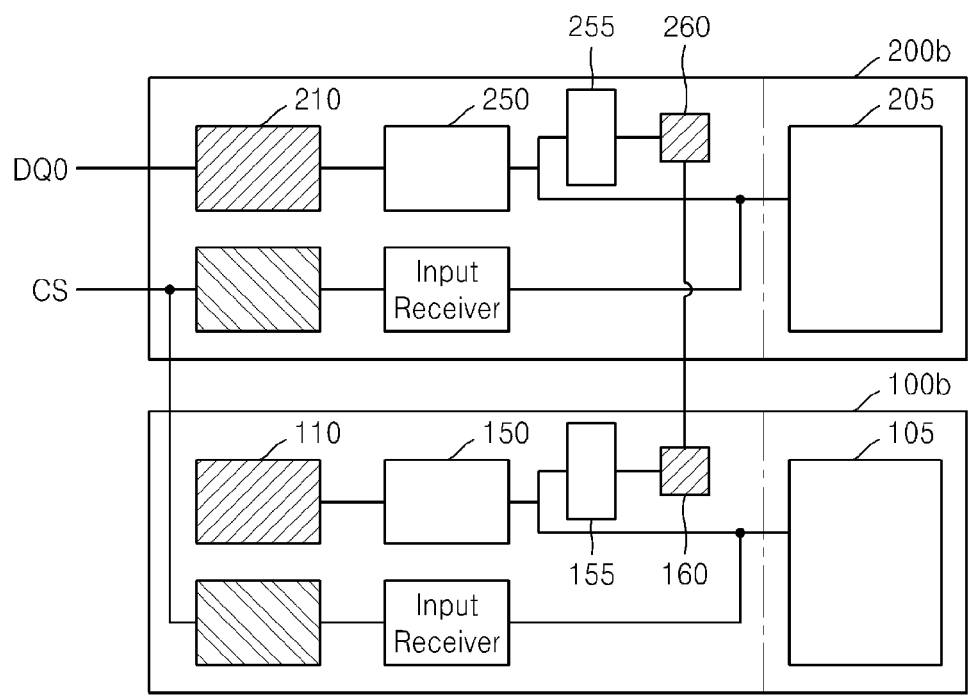

FIGS. 7A and 7B are circuit diagrams each illustrating a semiconductor package having an additional auxiliary buffer circuit, according to certain exemplary embodiments.

Referring to FIG. 7A, a first semiconductor chip 100a may further include an auxiliary I/O buffer circuit 155 between a terminal 160 and an internal circuit 105. The auxiliary I/O buffer circuit 155 may have a smaller buffering capacity than a first I/O buffer circuit 150. Thus, although a second I/O buffer circuit 250 of a second semiconductor chip 200 and the auxiliary I/O buffer circuit 155 are connected in series when a chip selection signal CS selects the first semiconductor chip 100a, the increase in the overall capacitance is not large, and thus, a high-speed operation is not hindered.

If a first semiconductor chip and a second semiconductor chip are of the same type, circuits of the first and second semiconductor chips may be configured as illustrated in FIG. 7B.

Referring to FIG. 7B, circuits of first and second semiconductor chips 100b and 200b may be configured so that the first semiconductor chip 100b and the second semiconductor chip 200b include auxiliary I/O buffer circuits 155 and 255, respectively. In detail, the circuit of the first semiconductor chip 100b may be configured so that the auxiliary I/O buffer circuit 155 and an internal circuit 105 are connected to the I/O buffer circuit 150 in parallel. In addition, the circuit of the second semiconductor chip 200b may be configured so that the auxiliary I/O buffer circuit 255 and an internal circuit 205 are connected to the I/O buffer circuit 250 in parallel.

Figure 8:
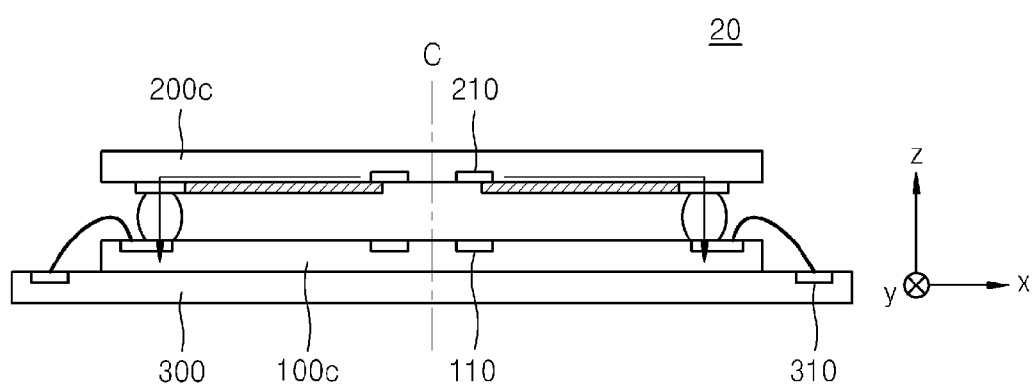
FIG. 8 is a cross-sectional side view conceptually illustrating a cross section of a semiconductor package in a y-direction, according to another exemplary embodiment.

FIG. 8 is a cross-sectional side view conceptually illustrating a cross section of a semiconductor package 20 in a y-direction, according to another exemplary embodiment.

Referring to FIG. 8, first and second semiconductor chips 100c and 200c are similar to the first and second semiconductor chips 100 and 200 of FIG. 2, respectively, and thus, detailed descriptions of components of the first and second semiconductor chips 100c and 200c are omitted.

As shown in FIG. 8, the second I/O pads 210 may be electrically connected directly to corresponding connection terminals 310 on the substrate 300 along a path indicated by an arrow. In this case, the connection terminals 310 may not be electrically directly connected to a semiconductor device in the first semiconductor chip 100. In particular, the second semiconductor chip 200, which includes the second I/O pads 210 which are electrically directly connected to the connection terminals 310, may function as a master chip. The first semiconductor chip 100, which does not have a semiconductor chip which is electrically directly connected to the connection terminals 310, may function as a slave chip.

Figure 9A:
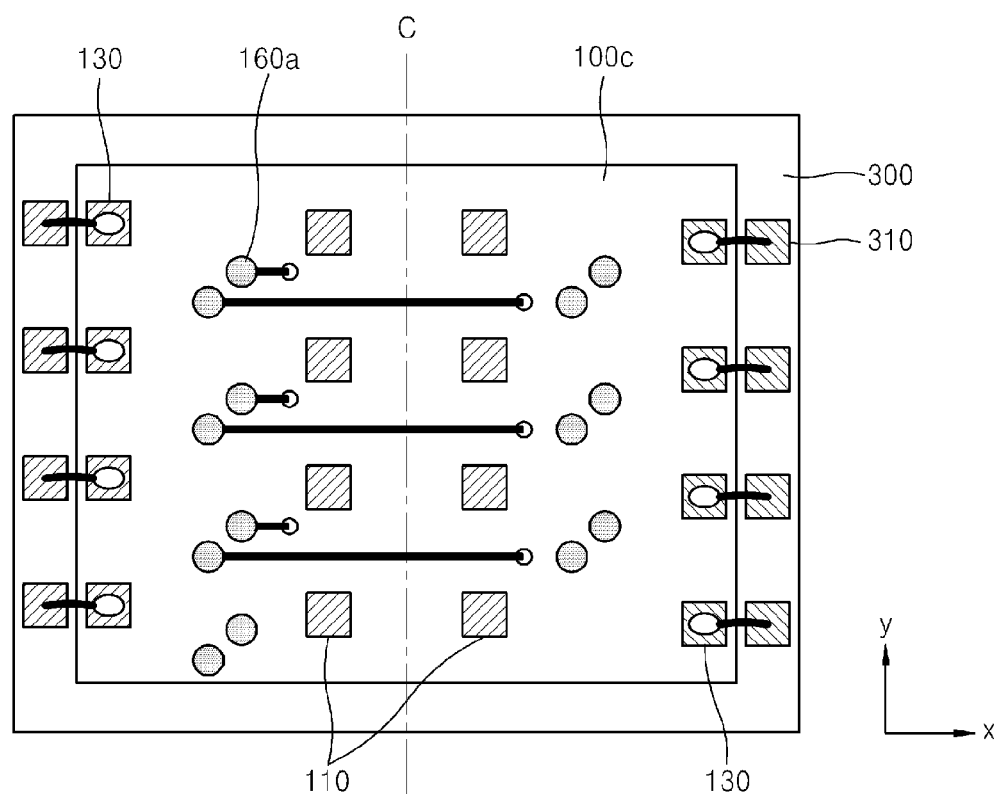
FIG. 9A is a plan view illustrating a first semiconductor chip and a substrate, according to one exemplary embodiment.
Figure 9B:
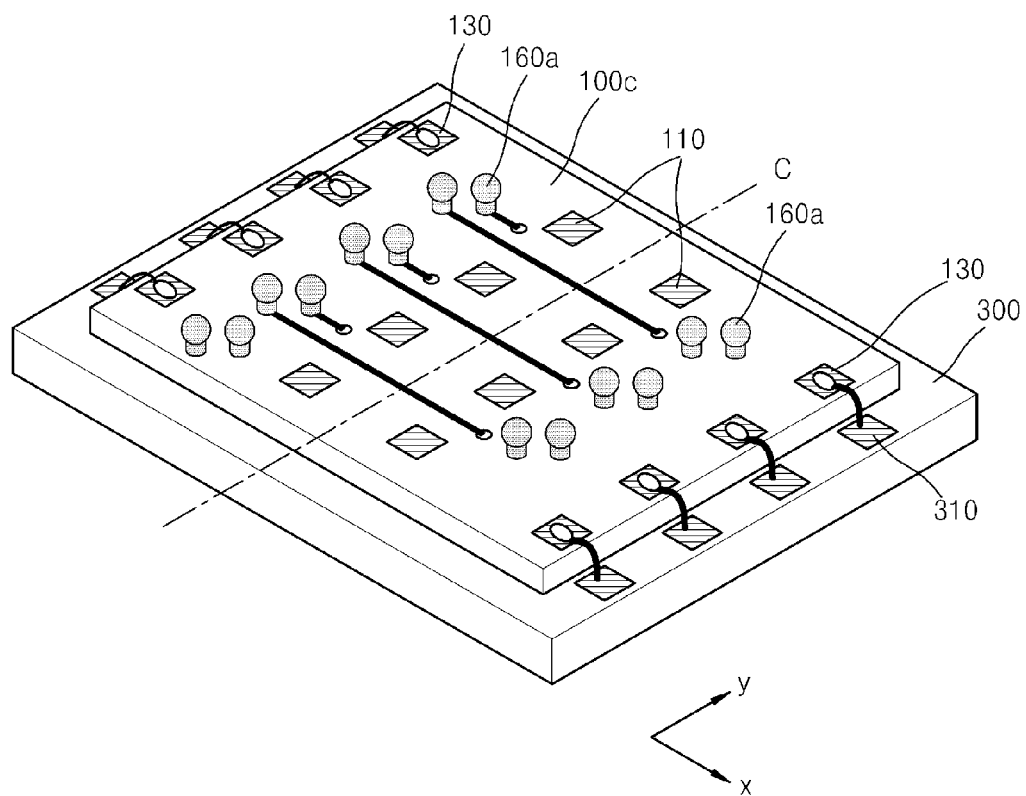
FIG. 9B is a perspective view illustrating a first semiconductor chip and a substrate, according to one exemplary embodiment.

FIG. 9A is a plan view illustrating a first semiconductor chip 100c and a substrate 300, according to one embodiment, and FIG. 9B is a perspective view illustrating the first semiconductor chip 100c and the substrate 300, according to one embodiment.

Referring to FIGS. 9A and 9B, the first semiconductor chip 100c is disposed on the substrate 300. First I/O pad sets 110, which include I/O pads symmetrically arranged in two columns to be adjacent to the central line C of the first semiconductor chip 100c, may be provided on an active surface of the first semiconductor chip 100c.

However, unlike the above-described embodiments, first routing redistribution wires or second routing terminals are not provided and first routing terminals 130 may be provided.

The first routing terminals 130 are electrically directly connected to corresponding connection terminals 310 on the substrate 300, respectively. For example, the first routing terminals 130 may be electrically directly connected to the connection terminals 310 via bonding wires. However, the inventive concept is not limited thereto.

Figure 10A:
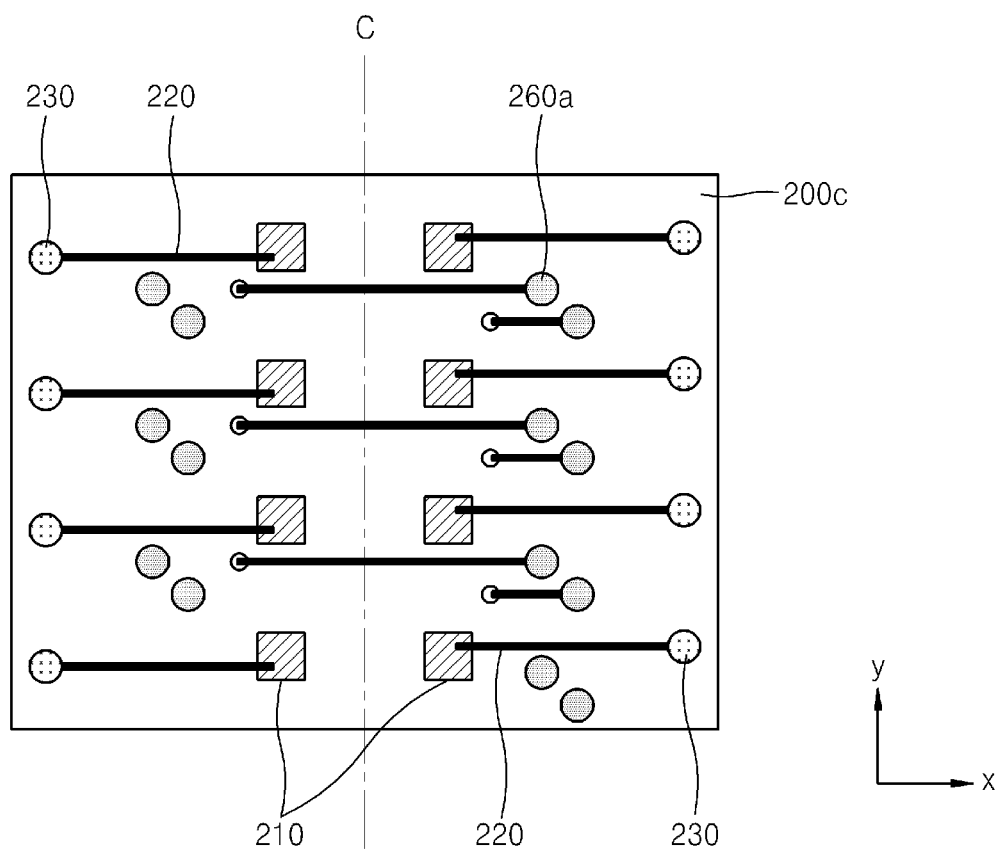
FIG. 10A is a plan view illustrating a second semiconductor chip according to one exemplary embodiment.
Figure 10B:
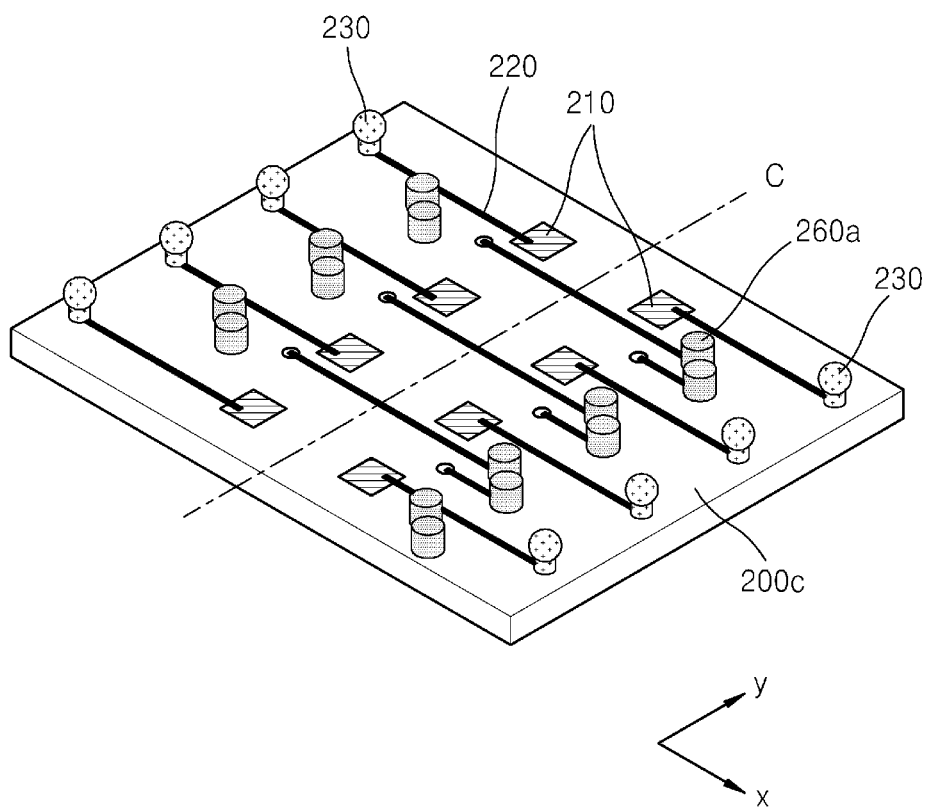
FIG. 10B is a perspective view illustrating a second semiconductor chip according to one exemplary embodiment.

FIG. 10A is a plan view illustrating a second semiconductor chip 200c according to one embodiment, and FIG. 10B is a perspective view illustrating the second semiconductor chip 200c according to one embodiment.

Referring to FIGS. 10A and 10B, second I/O pad sets 210, which includes I/O pads symmetrically arranged in two columns to be adjacent to the central line C of the second semiconductor chip 200c, may be provided on an active surface of the second semiconductor chip 200c.

Second routing redistribution wires 220 may be provided for the second I/O pad sets 210, respectively. The second routing redistribution wires 220 may extend without intersecting the central line C of the second semiconductor chip 200c.

Third routing terminals 230 may be provided at ends of the second routing redistribution wires 200 extending from the second I/O pad sets 210. The third routing terminals 230 are physically and/or electrically connected to corresponding first routing terminals 130 provided on the first semiconductor chip 100c of FIGS. 9A and 9B. Thus, locations of the first routing terminals 130 and locations of the third routing terminals 230 are configured to overlap with each other at the same location when the first semiconductor chip 100c and the second semiconductor chip 200c are so stacked that the active surfaces of the first and second semiconductor chips 100c and 200c face each other.

The first semiconductor chip 100c may include a plurality of fourth routing terminals 160a electrically connected to the internal circuit 105 of the first semiconductor chip 100c. The second semiconductor chip 200c may include a plurality of fifth routing terminals 260a electrically connected to the internal circuit 205 of the second semiconductor chip 200c. The plurality of fourth routing terminals 160a and the plurality of fifth routing terminals 260a may be configured to overlap with each other at the same location when the first semiconductor chip 100c and the second semiconductor chip 200c are so stacked that the active surfaces of the first and second semiconductor chips 100c and 200c face each other.

In this case, the plurality of fourth routing terminals 160a may be electrically directly connected to the plurality of fifth routing terminals 260a corresponding thereto. Furthermore, the plurality of fourth routing terminals 160a may physically directly contact the plurality of fifth routing terminals 260a corresponding thereto.

Considering FIGS. 9A, 9B, 10A, and 10B all together, unlike the embodiments of FIGS. 4A, 4B, 5A, and 5B, signals/data delivered to the first routing terminals 130 via the connection terminals 310 of the substrate 300 are directly delivered to the third routing terminals 230 of the second semiconductor chip 200c without passing through first routing redistribution wires and second routing terminals of the first semiconductor chip 100c. Continuously, the signals/data delivered to the third routing terminals 230 are delivered to the second I/O pads 210 via the second routing redistribution wires 220. In the manner, the signals/data which the substrate 300 transmits are delivered to the second semiconductor chip 200c. Signals/data that are transmitted from the second semiconductor chip 200c may be delivered to the substrate 300 in reverse order.

Figure 11:
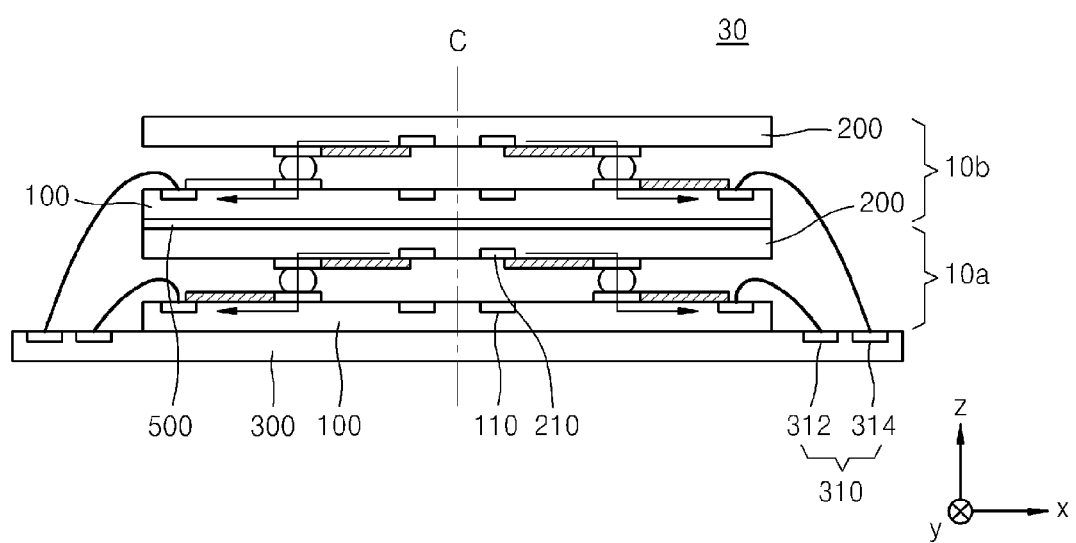
FIG. 11 is a cross-sectional side view conceptually illustrating a semiconductor package according to another exemplary embodiment.

FIG. 11 is a cross-sectional side view conceptually illustrating a semiconductor package 30 according to another exemplary embodiment.

Referring to FIG. 11, a first semiconductor chip set 10a and a second semiconductor chip set 10b are vertically stacked on a substrate 300. The first semiconductor chip set 10a and the second semiconductor chip set 10b may be combined with each other via an adhesive layer 500. The adhesive layer 500 may be a layer, which includes a material having an adhesive property, or an adhesive tape. However, the inventive concept is not limited thereto.

The first semiconductor chip set 10a includes a first semiconductor chip 100 and a second semiconductor chip 200. In one embodiment, configurations of the first and second semiconductor chips 100 and 200 are the substantially the same as those described with reference to FIGS. 2, 4A, 4B, 5A, and 5B, and thus, detailed descriptions thereof are omitted. The second semiconductor chip set 10b may have the same configuration as the first semiconductor chip set 10a, and thus, detailed descriptions thereof are omitted. A backside of the semiconductor chip 200 of chip set 10a may be connected to and adhered to a backside of the semiconductor chip 100 of chip set 10b.

First connection terminals 312, which are electrically connected to the first semiconductor chip set 10a via bonding wires, and second connection terminals 314, which are electrically connected to the second semiconductor chip set 10b via bonding wires, may be provided on the substrate 300.

Alternatively, the first semiconductor chip set 10a and the second semiconductor chip set 10b may be electrically connected to a common connection pad on the substrate 300 via bonding wires, By such a configuration, a high capacity and high density semiconductor package may be obtained without increasing foot prints of the semiconductor chips.

If a semiconductor package according to one or more of the above disclosed embodiments is used, a redistribution routing on semiconductor chips is simplified, and thus, a semiconductor package having high reliability and high performance may be obtained.

Figure 12:
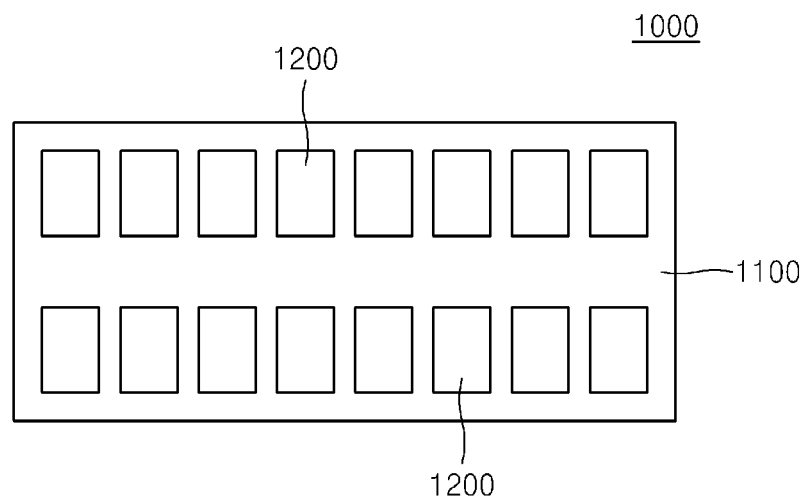
FIG. 12 is a plan view of a memory module including a semiconductor package according to one exemplary embodiment.

FIG. 12 is a plan view of a memory module 1000 including a semiconductor package according to one exemplary embodiment.

In particular, the memory module 1000 may include a printed circuit board 1100 and a plurality of semiconductor packages 1200.

The plurality of semiconductor packages 1200 may be or may include semiconductor packages according to the embodiments described above. In particular, the semiconductor packages 1200 may include at least one selected from the semiconductor packages according to the embodiments described above.

The memory module 1000 may be a single in-lined memory module (SIMM) in which the plurality of semiconductor packages 1200 are mounted on only a surface of the printed circuit board 1100 or a dual in-lined memory module (DIMM) in which the plurality of semiconductor packages 1200 are arranged on both surfaces of the printed circuit board 1100. In addition, the memory module 1000 may be a fully buffered DIMM having advanced memory buffers (AMBs) that respectively provide signals from the outside to the plurality of semiconductor packages 1200.

Figure 13:
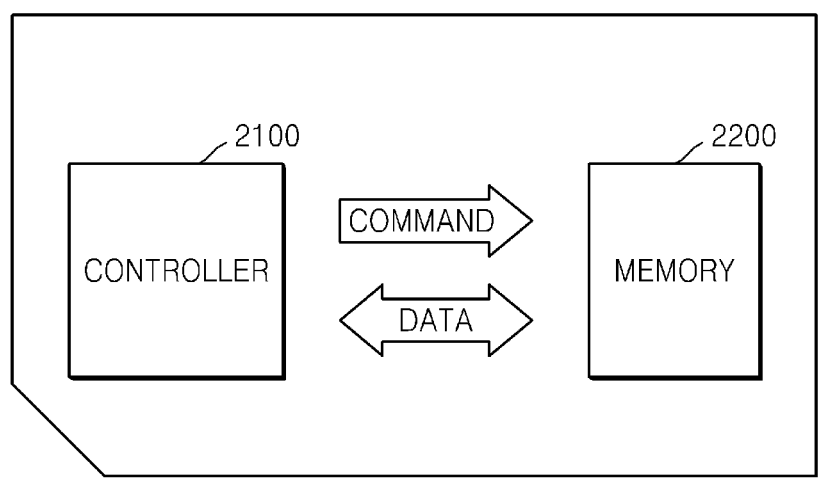
FIG. 13 is a schematic view of a memory card including a semiconductor package according to one exemplary embodiment.

FIG. 13 is a schematic view of a memory card 2000 including a semiconductor package according to one exemplary embodiment.

In particular, the memory card 2000 may be configured so that a controller 2100 and a memory 2200 exchange electrical signals. For example, when the controller 2100 sends a command to the memory 2200, the memory 2200 may transmit data.

The memory 2200 may include a semiconductor package according to one or more of the above-disclosed embodiments. In particular, the memory 2200 may include at least one selected from the semiconductor packages according to the above-disclosed embodiments.

The memory card 2000 may include various kinds of memory cards, such as a memory stick card, a smart media (SM) card, a secure digital (SD) card, mini-secure digital (mini SD) card, and a multimedia card (MMC).

Figure 14:
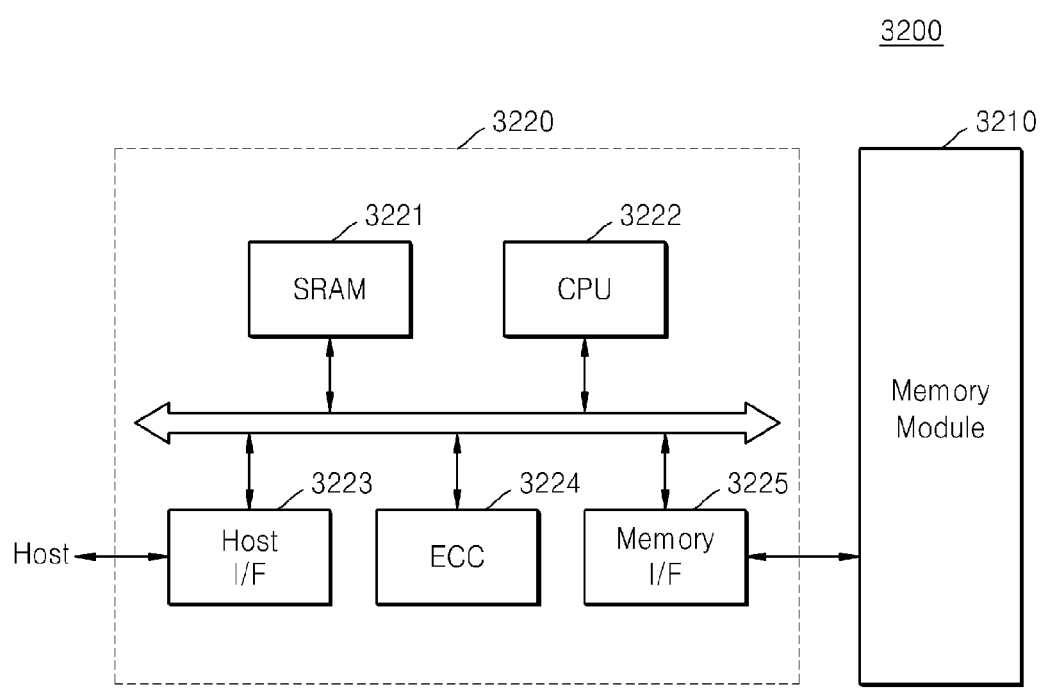
FIG. 14 is a block diagram illustrating a memory device including a semiconductor package according to one exemplary embodiment.

FIG. 14 is a block diagram illustrating a memory device 3200 including a semiconductor package according to one exemplary embodiment.

Referring to FIG. 14, the memory device 3200 includes a memory module 3210. The memory module 3210 may include at least one selected from the semiconductor packages described above. The memory module 3210 may further include other kinds of semiconductor memory devices (e.g., a nonvolatile memory device and/or an SRAM device). The memory device 3200 may include a memory controller 3220 for controlling data exchange between a host and the memory module 3210.

The memory controller 3220 may include a processing unit 3222 that controls an overall operation of a memory card. In addition, the memory controller 3220 may include an SRAM 3221 used as an operation memory of the processing unit 3222. The memory controller 3220 may further include a host interface 3223 and a memory interface 3225. The host interface 3223 may include a protocol for data exchange between the memory device 3200 and the host. The memory controller 3220 may interface with the memory module 3210 via the memory interface 3225. The memory controller 3220 may further include an error check correction (ECC) block 3224. The error check correction block 3224 may detect and correct an error of data read from the memory module 3210. The memory device 3200 may further include a ROM device that stores code data for interfacing with the host. The memory device 3200 may be embodied as a solid state drive (SSD) that may replace a hard disk of a computer system.

Figure 15:
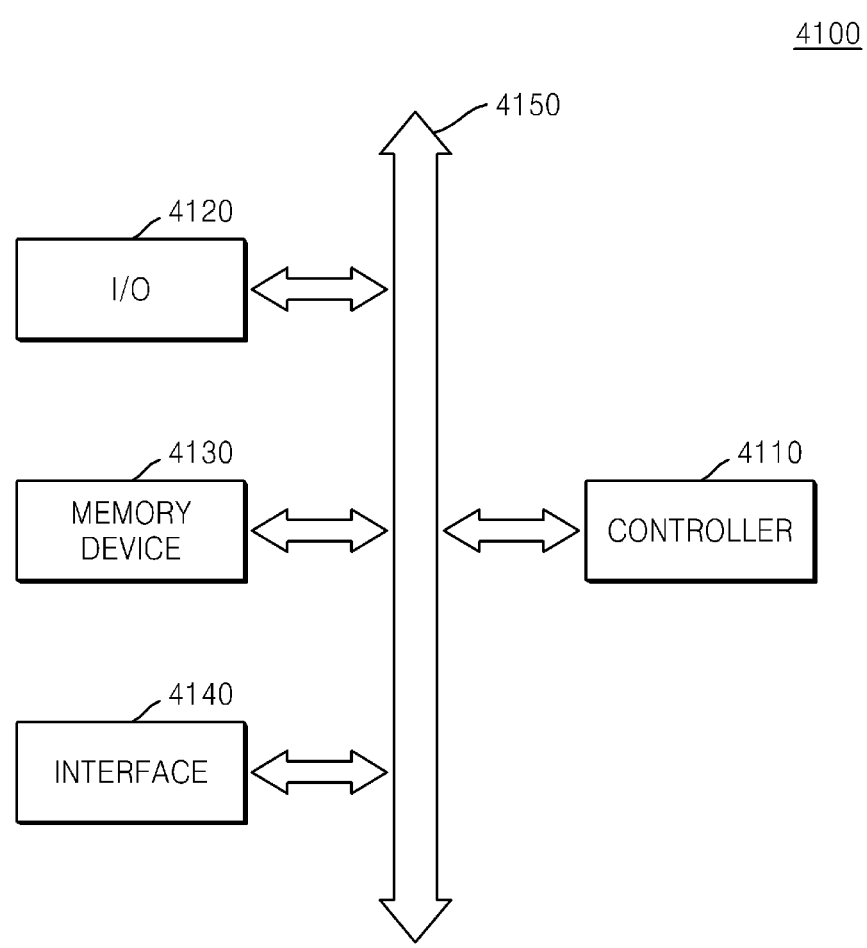
FIG. 15 is a block diagram illustrating an electronic system including a semiconductor package according to one exemplary embodiment.

FIG. 15 is a block diagram illustrating an electronic system 4100 including a semiconductor package according to another exemplary embodiment.

Referring to FIG. 15, the electronic system 4100 may include a controller 4110, an input/output (I/O) device 4120, a memory device 4130, an interface 4140, and a bus 4150. The controller 4110, the I/O device 4120, the memory device 4130, and/or the interface 4140 may be connected to one another through the bus 4150. The bus 4150 is a path for data transfer.

The controller 4110 may include at least one selected from a microprocessor, a digital signal processor, a microcontroller, and logic devices. The I/O device 4120 may include a keypad, a keyboard, and a display device. The memory device 4130 may store data and/or a command. The memory device 4130 may include at least one selected from the semiconductor packages described above. In addition, the memory device 4130 may further include other kinds of semiconductor memory devices (e.g., a nonvolatile memory device and/or an SRAM device). The interface 4140 may transmit data to a communications network or receive data from the communications network. The interface 4140 may be wired or wireless. For example, the interface 4140 may include an antenna or a wired or wireless transceiver. Although not illustrated in FIG. 15, the electronic system 4100 may further include a high-speed DRAM device and/or SRAM device as an operation memory device for improving an operation of the controller 4110.

The electronic system 4100 may be applied to a personal digital assistance (PDA), a portable computer, a web tablet, a wireless phone, a mobile phone, a digital music player, a memory card, and any kind of electronic products capable of receiving and/or transmitting information wirelessly.

Figure 16:
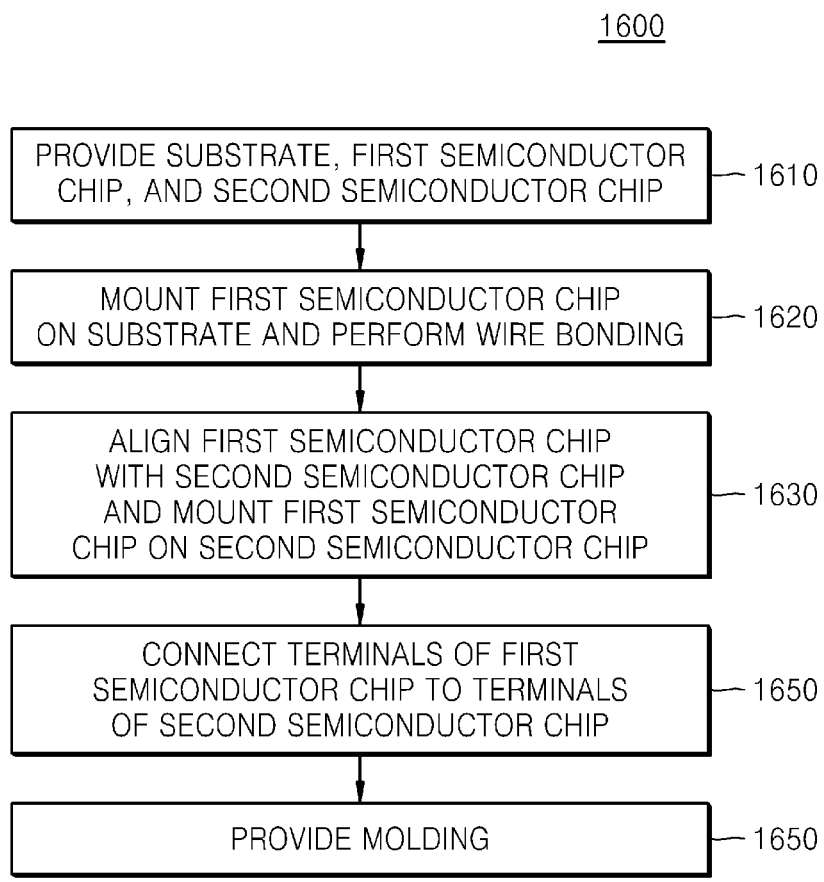
FIG. 16 is a flow chart illustrating an exemplary method of manufacturing a semiconductor package, according to one embodiment.

FIG. 16 is a flow chart illustrating an exemplary method 1600 of manufacturing and providing a semiconductor package, according to one embodiment. In step 1610, a substrate, a first semiconductor chip, and a second semiconductor chip are prepared and provided. For example, a substrate such as substrate 300 described in FIGS. 1-6 or the other embodiments maybe prepared and provided. In addition, a first semiconductor chip 100 and second semiconductor chip 200, such as described in FIGS. 1-6 or the other embodiments may be prepared and provided. In step 1620, a first semiconductor chip (e.g., semiconductor chip 100) is mounted on a substrate (e.g., substrate 300), and wire bonding is performed to connect terminals of the substrate (e.g., 310) to terminals of the first semiconductor chip (e.g., terminals 130). In step 1630, the second semiconductor chip is aligned with and is mounted on the first semiconductor chip such that active surfaces of the two chips face each other. In step 1640, respective terminals of the first and second semiconductor chips are connected to each other (e.g., terminals 160a and 260a, and terminals 140 and 230).

For example, a heat treatment process may be performed to bond a portion of terminals of the first semiconductor chip to a portion of the terminals of the second semiconductor chip. As a result of steps 1610-1640, a plurality of first conductive interconnects may electrically directly connect terminals of the substrate to I/O pads of the second semiconductor chip through terminals of the first semiconductor chip, and a plurality of second conductive interconnects may electrically connect internal circuits of the second semiconductor chip connected to the I/O pads to internal circuitry of the first semiconductor chip. In step 1650, a molding (e.g., 400) is provided on the substrate to cover the first and second semiconductor chips, and a top surface of the substrate exposed by the semiconductor chips. The molding may additionally fill in portions between the substrate and the first semiconductor chip and between the first semiconductor chip and the second semiconductor chip.

Although the steps of FIG. 16 are shown to occur in a particular order, they need not be performed in that order. For example, in certain embodiments, step 1630 and 1640 may occur prior to step 1620. Further, in certain embodiments, steps 1630 and 1640 may occur substantially simultaneously.

While the present disclosure has been particularly shown and described with reference to exemplary embodiments thereof, it will be understood that various changes in form and details may be made therein without departing from the spirit and scope of the following claims.

What is claimed is:

1. A semiconductor package comprising:
    a substrate; and
    a pair of semiconductor chips disposed on the substrate so that active surfaces of the pair of semiconductor chips face each other,
    wherein the pair of semiconductor chips comprise a first semiconductor chip disposed closer to the substrate and a second semiconductor chip disposed farther from the substrate, and a plurality of connection terminals disposed on the substrate are electrically directly connected, through the first semiconductor chip, to a plurality of terminals disposed on the second semiconductor chip and to one or more semiconductor devices of the second semiconductor chip, and
    wherein the first semiconductor chip is electrically connected to the substrate through a path having an end point at a connection terminal on the substrate, continuing to an input and output (I/O) pad on the second semiconductor chip electrically directly connected to the connection terminal, continuing to at least one active device of the second semiconductor chip, and continuing to a terminal between the second semiconductor chip and the first semiconductor chip.

2. The semiconductor package of claim 1, wherein the plurality of connection terminals disposed on the substrate are not electrically directly connected to a semiconductor device in the first semiconductor chip.

3. The semiconductor package of claim 1, wherein to electrically directly connect the plurality of connection terminals disposed on the substrate to the plurality of terminals disposed on the second semiconductor chip, the plurality of connection terminals disposed on the substrate are electrically connected to the plurality of terminals disposed on the second semiconductor chip via first routing redistribution wires on the first semiconductor chip.

4. The semiconductor package of claim 3, wherein the first routing redistribution wires connect a plurality of first routing terminals of the first semiconductor chip, which are electrically connected to corresponding connection terminals disposed on the substrate, to a plurality of respective second routing terminals of the first semiconductor chip, which are electrically connected to corresponding routing terminals disposed on the second semiconductor chip.

5. The semiconductor package of claim 4, wherein the first semiconductor chip includes first input/output (I/O) pad sets arranged in two columns to be adjacent to a central line of the first semiconductor chip and the second semiconductor chip includes second (I/O) pad sets arranged in two columns to be adjacent to a central line of the second semiconductor chip, and locations and functions of the first I/O pad sets disposed on the first semiconductor chip are the same as those of the second I/O pad sets disposed on the second semiconductor chip.

6. The semiconductor package of claim 5, wherein the first routing redistribution wires extend without intersecting the central line of the first semiconductor chip.

7. The semiconductor package of claim 5, wherein the second semiconductor chip includes:
a plurality of third routing terminals corresponding to the plurality of second routing terminals, respectively; and
second routing redistribution wires for electrically connecting the plurality of third routing terminals to corresponding I/O pads of the second I/O pad sets, respectively.

8. The semiconductor package of claim 7, wherein the plurality of second routing terminals and the plurality of third routing terminals overlap with each other when an active surface of the first semiconductor chip and an active surface of the second semiconductor chip face each other.

9. The semiconductor package of claim 7, wherein the second routing redistribution wires extend without intersecting the central line of the second semiconductor chip.

10. The semiconductor package of claim 5, wherein the first semiconductor chip includes a first I/O buffer circuit for buffering a signal that is input from or output to an external circuit, the second semiconductor chip comprises a second I/O buffer circuit for buffering a signal that is input from or output to an external circuit, the second I/O buffer circuit is operably connected to the substrate, and the first I/O buffer circuit is disabled.

11. The semiconductor package of claim 10, wherein the first semiconductor chip is configured to input or output a signal via the second I/O buffer circuit.

12. The semiconductor package of claim 11, wherein the first semiconductor chip comprises a plurality of fourth routing terminals electrically connected to an internal circuit of the first semiconductor chip, the second semiconductor chip comprises a plurality of fifth routing terminals electrically connected to an internal circuit of the second semiconductor chip, the plurality of fourth routing terminals are electrically directly connected to the plurality of fifth routing terminals, and the first semiconductor chip is electrically connected to the second I/O buffer circuit of the second semiconductor chip via the plurality of fourth routing terminals and the plurality of fifth routing terminals to input or output a signal via the second I/O buffer circuit.

13. The semiconductor package of claim 10, wherein I/O pads of the second I/O pad sets are electrically directly connected to the second I/O buffer circuit corresponding to each of the I/O pads and not to any other I/O buffer circuits.

14. The semiconductor package of claim 1, wherein the one or more semiconductor devices of the second semiconductor chip are electrically connected to the plurality of connection terminals disposed on the substrate without the use of through substrate vias.

15. A semiconductor package comprising:
a substrate; and
a pair of semiconductor chips disposed on the substrate so that active surfaces of the pair of semiconductor chips face each other,
wherein the pair of semiconductor chips comprise a slave chip disposed closer to the substrate and a master chip disposed farther from the substrate, the master chip is a center pad-type semiconductor chip in which a plurality of I/O pads are symmetrically arranged in two columns to be adjacent to a central line of the master chip, and wires for sending and receiving signals between the plurality of I/O pads of the master chip and the substrate do not intersect the central line.

16. The semiconductor package of claim 15, wherein the slave chip comprises a plurality of first I/O pads symmetrically arranged in two columns to be adjacent to the central line of the slave chip, the plurality of I/O pads of the master chip is a plurality of second I/O pads, and locations and functions of the plurality of first I/O pads are the same as those of the plurality of second I/O pads.

17. The semiconductor package of claim 16, wherein the plurality of second I/O pads are electrically directly connected to a plurality of connection terminals disposed on the substrate.

18. The semiconductor package of claim 16, wherein the plurality of second I/O pads are electrically connected to a plurality of connection terminals disposed on the substrate via first routing redistribution wires formed on the slave chip.

19. The semiconductor package of claim 15, wherein the pair of semiconductor chips form a stack of semiconductor chips on the substrate, and consist of the only semiconductor chips of the stack.

20. A semiconductor package comprising:
a substrate; and
first and second semiconductor chips sequentially disposed on the substrate so that active surfaces of the first and second semiconductor chips face each other,
wherein:
the first semiconductor chip is located between the substrate and the second semiconductor chip, and the second semiconductor chip is in a flip chip configuration with respect to the substrate,
the first and second semiconductor chips are center pad-type semiconductor chips each in which a plurality of I/O pads are symmetrically arranged in two columns to be adjacent to a central line thereof,
the first semiconductor chip includes first routing redistribution wires on an active surface thereof, a plurality of first routing terminals, which are connected to corresponding connection terminals disposed on the substrate, and a plurality of second routing terminals which are connected to corresponding terminals disposed on the second semiconductor chip,
the second semiconductor chip includes second routing redistribution wires on an active surface thereof,
the second routing redistribution wires electrically connect a plurality of third routing terminals corresponding to the plurality of second routing terminals to I/O pads of the second semiconductor chip, and
the first routing redistribution wires extend between the first routing terminals and the second routing terminals of the first semiconductor chip without intersecting the central line of the first semiconductor chip and the second routing redistribution wires extend without intersecting the central line of the second semiconductor chip.

21. The semiconductor package of claim 20, wherein the plurality of first routing terminals are connected to the corresponding connection terminals disposed on the substrate through wire bonding.

22. The semiconductor package of claim 20, wherein the first semiconductor chip and the second semiconductor chip form a stack of semiconductor chips on the substrate, and consist of the only semiconductor chips of the stack.

\* \* \* \* \*